(12) United States Patent
Han et al.

(10) Patent No.: US 11,495,873 B2
(45) Date of Patent: Nov. 8, 2022

(54) DEVICE COMPRISING MULTI-DIRECTIONAL ANTENNAS IN SUBSTRATES COUPLED THROUGH FLEXIBLE INTERCONNECTS

(71) Applicant: QUALCOMM Incorporated, San Diego, CA (US)

(72) Inventors: Jeahyeong Han, San Diego, CA (US); Rajneesh Kumar, San Diego, CA (US); Suhyung Hwang, Rancho Mission Viejo, CA (US); Jaehyun Yeon, San Diego, CA (US); Mohammad Ali Tassoudji, San Diego, CA (US); Darryl Sheldon Jessie, San Diego, CA (US); Ameya Galinde, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 170 days.

(21) Appl. No.: 16/810,621

(22) Filed: Mar. 5, 2020

(65) Prior Publication Data

US 2021/0280959 A1    Sep. 9, 2021

(51) Int. Cl.
*H01Q 1/22* (2006.01)
*H01L 21/56* (2006.01)
(Continued)

(52) U.S. Cl.
CPC ......... *H01Q 1/2283* (2013.01); *H01L 21/565* (2013.01); *H01L 23/3121* (2013.01); *H01L 23/5383* (2013.01); *H01L 23/5386* (2013.01); *H01L 23/5387* (2013.01); *H01L 23/552* (2013.01); *H01L 23/66* (2013.01);
(Continued)

(58) Field of Classification Search
CPC ........ H01Q 1/2283; H01Q 1/36; H01Q 1/526; H01L 21/565; H01L 23/3121; H01L 23/5386; H01L 23/5387; H01L 23/552; H01L 23/66; H01L 21/4857; H01L 24/16; H01L 25/165; H01L 2223/6677; H01L 2224/16227; H01L 2924/19105;
(Continued)

(56) References Cited

U.S. PATENT DOCUMENTS 11,122,694 B2 * 9/2021 Min .................. H05K 3/22
2015/0163937 A1    6/2015 McClatchie et al.
(Continued)

FOREIGN PATENT DOCUMENTS

WO    2018207500 A1    11/2018

OTHER PUBLICATIONS

International Search Report and Written Opinion—PCT/US2021/019046—ISA/EPO—dated Jul. 6, 2021.

*Primary Examiner* — Bi N H B Tran
(74) *Attorney, Agent, or Firm* — Loza & Loza, LLP

(57) ABSTRACT

A device that includes a first substrate comprising a first antenna, an integrated device coupled to the first substrate, an encapsulation layer located over the first substrate and the integrated device, a second substrate comprising a second antenna, and a flexible connection coupled to the first substrate and the second substrate. The device includes a shield formed over a surface of the encapsulation layer and a surface of the first substrate. The shield includes an electromagnetic interference (EMI) shield.

25 Claims, 20 Drawing Sheets

(51) Int. Cl.
*H01L 23/31* (2006.01)
*H01L 23/538* (2006.01)
*H01L 23/552* (2006.01)
*H01L 23/66* (2006.01)
*H01Q 1/36* (2006.01)
*H01Q 1/52* (2006.01)
*H05K 1/18* (2006.01)
*H05K 9/00* (2006.01)
*H01L 21/48* (2006.01)
*H01L 23/00* (2006.01)
*H01L 25/16* (2006.01)

(52) U.S. Cl.
CPC ............... *H01Q 1/36* (2013.01); *H01Q 1/526* (2013.01); *H05K 1/185* (2013.01); *H05K 9/0081* (2013.01); *H01L 21/4857* (2013.01); *H01L 24/16* (2013.01); *H01L 25/165* (2013.01); *H01L 2223/6677* (2013.01); *H01L 2224/16227* (2013.01); *H01L 2924/19105* (2013.01); *H01L 2924/3025* (2013.01); *H05K 2201/10098* (2013.01)

(58) Field of Classification Search
CPC ............ H01L 2924/3025; H05K 1/185; H05K 9/0081; H05K 2201/10098
USPC ........................................................ 343/841
See application file for complete search history.

(56) References Cited

U.S. PATENT DOCUMENTS

| | | |
|---|---|---|
| 2018/0159209 A1 | 6/2018 | Mikata et al. |
| 2019/0103653 A1* | 4/2019 | Jeong ..................... H01Q 1/526 |
| 2020/0015357 A1* | 1/2020 | Kim ........................ H01L 23/13 |
| 2020/0021015 A1 | 1/2020 | Yun et al. |
| 2020/0136238 A1* | 4/2020 | Iwata ..................... H05K 1/028 |

* cited by examiner

PROFILE VIEW

PROFILE VIEW

US 11,495,873 B2

DEVICE COMPRISING MULTI-DIRECTIONAL ANTENNAS IN SUBSTRATES COUPLED THROUGH FLEXIBLE INTERCONNECTS

FIELD

Various features relate to devices with an antenna, but more specifically to a device that includes multi-directional antennas in substrates coupled through flexible interconnects.

BACKGROUND

FIG. 1 illustrates a package 100 that includes a substrate 102 and a die 103. The die 103 is coupled to the substrate 102. The substrate 102 includes a dielectric layer 120 and a plurality of interconnects 122. The substrate 102 also includes a first antenna 150 and a second antenna 160. Both the first antenna 150 and the second antenna 160 are embedded in the substrate 102. The first antenna 150 is defined by a first plurality of interconnects 152, and the second antenna 160 is defined by a second plurality of interconnects 162. Both the first antenna 150 and the second antenna 160, are pointed in the same direction, which may limit the overall performance of the package 100 because signals may come from different directions. There is an ongoing need to provide packages with improved transmission and reception performances.

SUMMARY

Various features relate to devices with an antenna, but more specifically to a device that includes multi-directional antennas in substrates coupled through flexible interconnects.

One example provides a device that includes a first substrate comprising a first antenna, an integrated device coupled to the first substrate, an encapsulation layer located over the first substrate and the integrated device, a second substrate comprising a second antenna, and a flexible connection coupled to the first substrate and the second substrate.

Another example provides an apparatus that includes a first substrate comprising a first antenna, an integrated device coupled to the first substrate, means for encapsulation located over the first substrate and the integrated device, a second substrate comprising a second antenna, and means for flexible connection coupled to the first substrate and the second substrate.

Another example provides a method for fabricating a device. The method provides a substrate that includes a first antenna and a second antenna. The method removes portions of the substrate to define (i) a first substrate comprising the first antenna, (ii) a second substrate comprising the second antenna, and (iii) a flexible connection coupled to the first substrate and the second substrate. The method couples an integrated device to the substrate. The method forms an encapsulation layer over the substrate and the integrated device.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a first substrate comprising a first antenna, an integrated device coupled to the first substrate, an encapsulation layer located over the first substrate and the integrated device, a second substrate comprising a second antenna, and a flexible connection coupled to the first substrate and the second substrate. The flexible connection is embedded in the first substrate and the second substrate. The first antenna may be embedded in the first substrate. The second antenna may be embedded in the second substrate. The first antenna may be configured to be facing a first antenna direction. The second antenna may be configured to be facing a second antenna direction that is different than the first antenna direction. The device includes a shield formed over a surface of the encapsulation layer and a surface of the first substrate. The shield may be formed over a side surface of the first substrate. The shield includes an electromagnetic interference (EMI) shield. The device described in the disclosure may provide an antenna device or an antenna in package (AiP) that has a smaller form factor and/or provides better performance (e.g., better transmission and reception performance) through the use of multi-directional antennas and the shielding of various components of the device and/or package. The device and/or AiP may include a radio frequency (RF) package.

Figure 1:
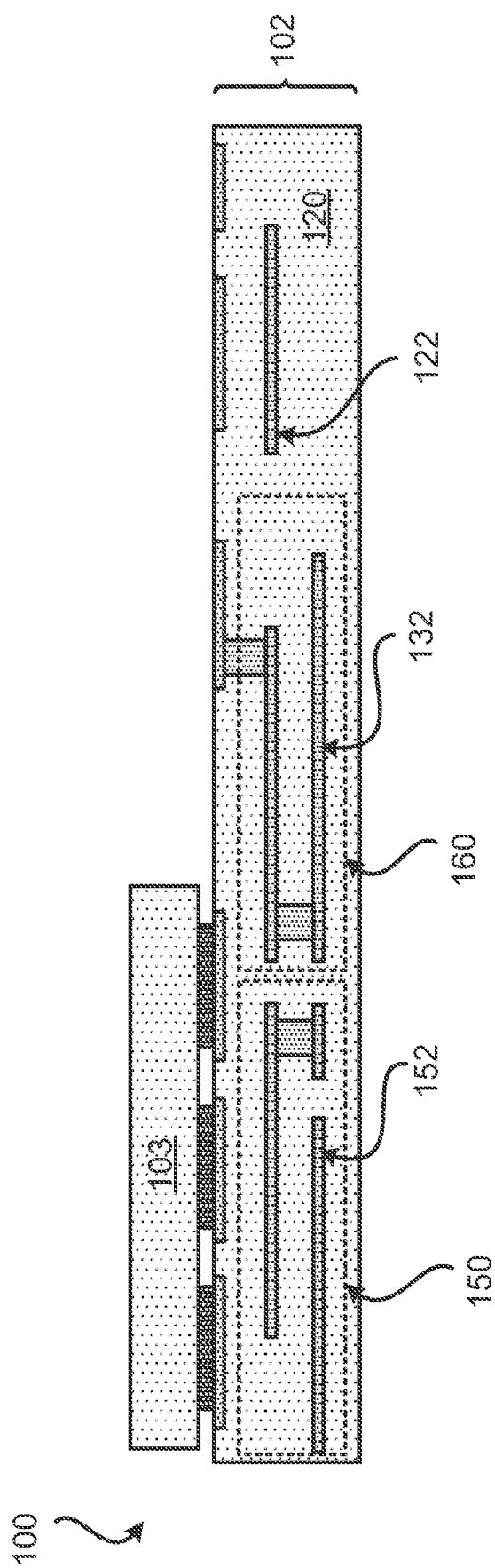
FIG. 1 illustrates a profile view of a package that includes a substrate with antennas embedded in the substrate.
Figure 2:
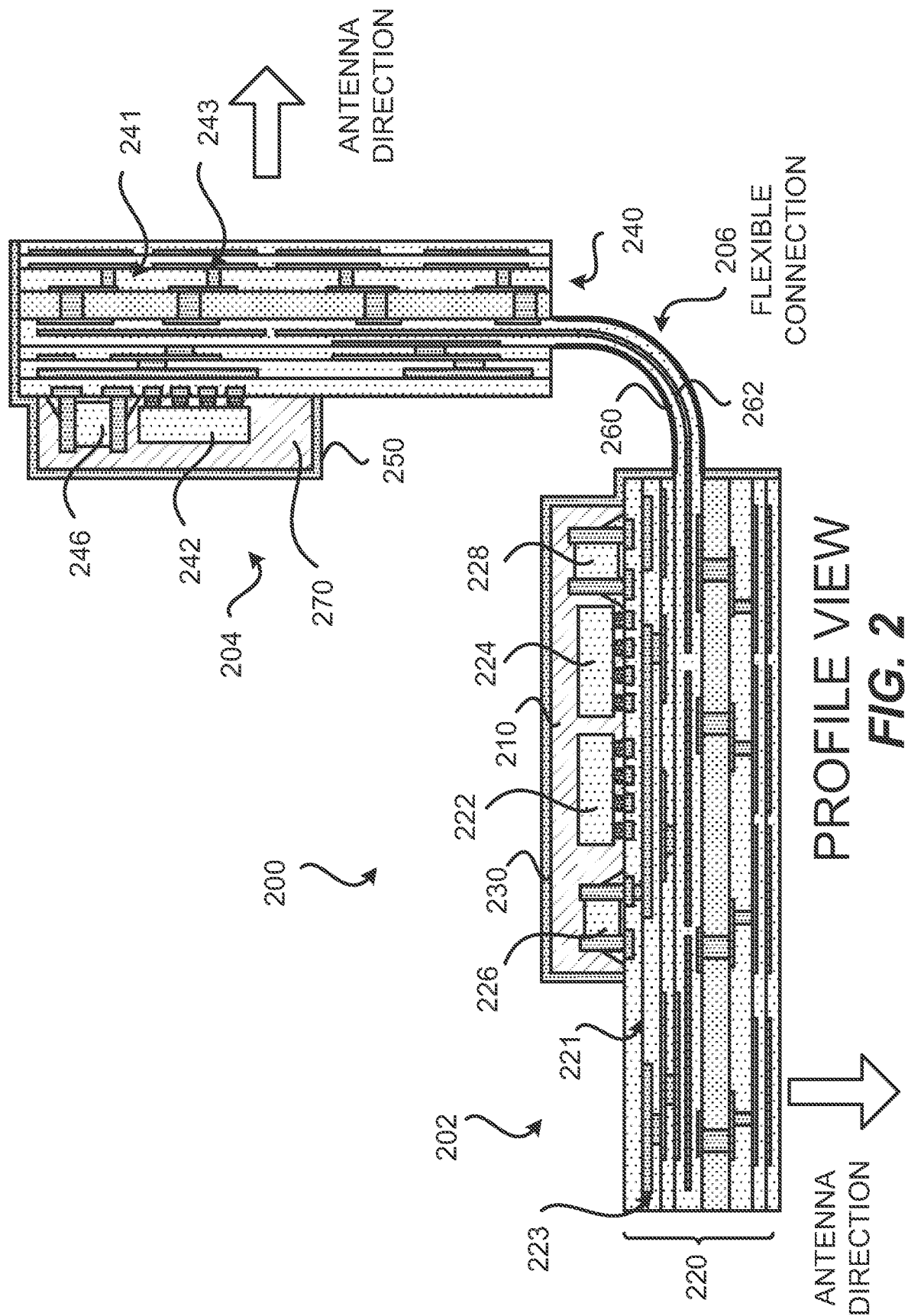
FIG. 2 illustrates a profile view of an exemplary device that includes substrates each having an embedded antenna, where the substrates are coupled through a flexible connection.

Exemplary Device Comprising Substrates with Multi-Directional Antennas and Flexible Connection FIG. 2 illustrates a profile view of a device 200 that includes a package 202, a package 204, and a flexible connection 206. As will be further described below, the device 200 includes multi-directional antennas that help improve the performance of the device 200. The device 200 may include an antenna in package (AiP). The device 200 may include a radio frequency (RF) package. The device 200 may be configured to provide Wireless Fidelity (WiFi) communication and/or cellular communication (e.g., 2G, 3G, 4G, 5G). The device 200 may be configured to support Global System for Mobile Communications (GSM), Universal Mobile Telecommunications System (UMTS), and/or Long-Term Evolution (LTE). The device 200 may be configured to transmit and receive signals having different frequencies and/or communication protocols.

The package 202 (e.g., first package) includes a substrate 220 (e.g., first substrate), one or more integrated devices (e.g., 222, 224), one or more passive devices (e.g., 226, 228), an encapsulation layer 210, and a shield 230. The substrate 220 includes one or more dielectric layers 221 and a plurality of interconnects 223. The integrated devices may include a die (e.g., processor die, memory die). As will be further described below, some of the plurality of interconnects 223 may be configured as one or more antennas.

The package 204 (e.g., second package) includes a substrate 240 (e.g., second substrate), one or more integrated devices (e.g., 242), one or more passive devices (e.g., 246), an encapsulation layer 270, and a shield 250. The substrate 240 includes one or more dielectric layers 241 and a plurality of interconnects 243. The integrated devices may include a die (e.g., processor die, memory die). As will be further described below, some of the plurality of interconnects 243 may be configured as one or more antennas (e.g., at least one interconnect from the plurality of interconnects 243 may define at least one antenna).

The package 202 is coupled to the package 204 though the flexible connection 206. Thus, the flexible connection 206 may be coupled to the package 202 (e.g., first package) and the package 204 (e.g., second package). The flexible connection 206 may be embedded in the package 202 and the package 204. The flexible connection 206 includes at least one dielectric layer 260 and at least one interconnect 262. The at least one dielectric layer 260 may include polyimide or liquid crystal polymer. The flexible connection 206 may be configured to electrically couple the package 202 and the package 204. The flexible connection 206 may be configured to allow different currents (e.g., signal, power, ground) to travel between the package 202 and the package 204. For example, the flexible connection 206 may include (i) at least one first interconnect configured for a signal (e.g., input/output signal), (ii) at least one second interconnect configured for power, and (iii) at least one third interconnect configured for ground. The flexible connection 206 is bendable such that the package 204 may be positioned at an angle to the package 202, and vice versa. The flexible connection 206 may be means for flexible connection. Although not shown, the flexible connection 206 may include a cover protective material or be covered with a protective material. In at least some implementations, the flexible connection 206 may be configured to be bendable up to 180 degrees without fracturing. Thus, for example, components of the flexible connection 206, such as the at least one dielectric layer 260 and the at least one interconnect 262, may bend up to 180 degrees without causing damage, a crack and/or a fracture in the flexible connection 206. Various implementations of the flexible connection 206 may be bendable up to different degrees. For example, in at least some implementations, the flexible connection 206 may be configured to be bendable up to 90 degrees without fracturing and/or cracking. In at least some implementations, the flexible connection 206 may be configured to be bendable by at least 10 degrees (or more) without fracturing and/or cracking. The term "flexible" may mean that a component is (i) bendable by at least 10 degrees (or more) without fracturing and/or cracking, and/or (ii) bendable up to 180 degrees without fracturing and/or cracking.

As shown in FIG. 2, the package 202 is positioned relative to the package 204 such that the antenna direction for the package 202 faces a first direction (e.g., along X direction, Y direction, Z direction), and the antenna direction for the package 204 faces a second direction (e.g., along Y direction, Y direction, Z direction) that is different than the first direction. For example, the package 202 may include a first antenna that includes a first antenna direction, and the package 204 may include a second antenna that includes a second antenna direction. This configuration and/or other configurations, may allow the device 200 to provide better transmission and/or reception performance, as the various antennas are aligned in multiple and different directions, instead of just one direction.

Figure 3:
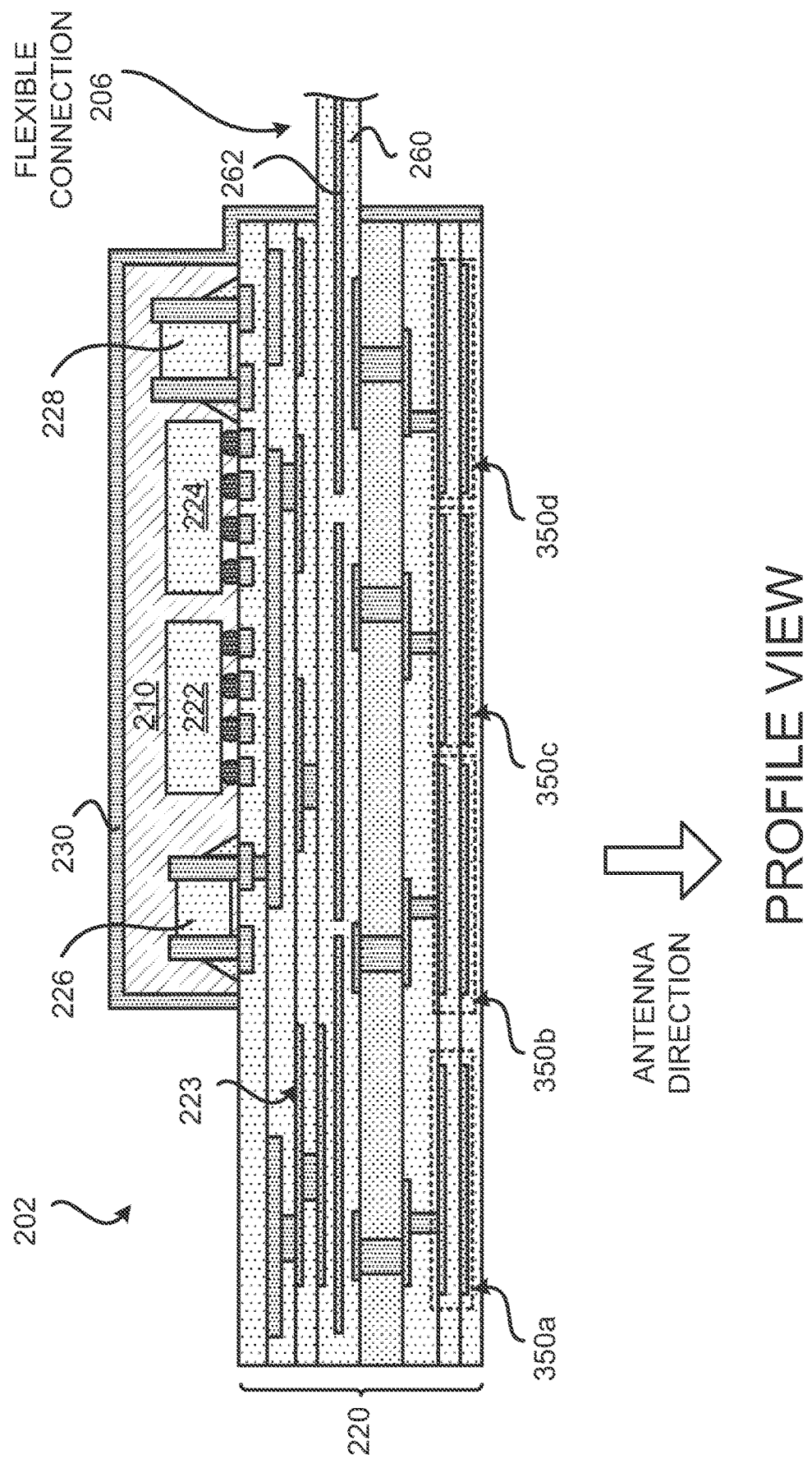
FIG. 3 illustrates a profile view of an exemplary first substrate comprising a flexible connection and an embedded antenna.

FIG. 3 illustrates a profile close up view of the package 202 of the device 200. As shown in FIG. 3, the package 202 includes the substrate 220, the integrated device 222, the integrated device 224, the passive device 226, the passive device 228, the encapsulation layer 210, and the shield 230. The substrate 220 includes one or more dielectric layers 221 and a plurality of interconnects 223 (e.g., traces, pads, vias). The one or more dielectric layers 221 may include prepreg, Ajinomoto Build-up Film (ABF), polyimide, and/or combinations thereof. The substrate 220 includes a first surface (e.g., top surface) and a second surface (e.g., bottom surface). The integrated device 222, the integrated device 224, the passive device 226, and the passive device 228 are coupled to the first surface of the substrate 220. The encapsulation layer 210 is located over the first surface of the substrate 220, such that the encapsulation layer 210 encapsulates the integrated device 222, the integrated device 224, the passive device 226, and the passive device 228. The encapsulation layer 210 may include a mold, a resin and/or an epoxy. The encapsulation layer 210 may be means for encapsulation. The shield 230 is located and formed over the outer surface of the encapsulation layer 210 and one or more surfaces of the substrate 220. For example, the shield 230 may be formed and located over the first surface and/or a side surface of the substrate 220. The shield 230 includes an electromagnetic interference (EMI) shield. The shield 230 may be means for shielding (e.g., means for EMI shielding).

As mentioned above, the substrate 220 includes a plurality of interconnects 223, where some of the interconnects may be configured to operate as one or more antennas. FIG. 3 illustrates antennas (e.g., 350*a*, 350*b*, 350*c*, 350*d*) formed in the substrate 220. The antennas (e.g., 350*a*, 350*b*, 350*c*, 350*d*) may be embedded antennas that are formed based on interconnects from the plurality of interconnects 223. The antennas (e.g., 350*a*, 350*b*, 350*c*, 350*d*) may be located (e.g., embedded) in the substrate 220 such that the antennas (e.g., 350*a*, 350*b*, 350*c*, 350*d*) face towards the second surface (e.g., bottom surface) of the substrate 220. The direction in which the second surface of the substrate 220 faces may be considered the antenna direction (e.g., first antenna direction) for the antennas (e.g., 350*a*, 350*b*, 350*c*, 350*d*). The antennas (e.g., 350*a*, 350*b*, 350*c*, 350*d*) may be electrically coupled to one or more of the integrated devices (e.g., 222, 224) through the plurality of interconnects 223.

FIG. 3 also illustrates the flexible connection 206 coupled to the substrate 220. The flexible connection 206 may be embedded in the substrate 220. The flexible connection 206 may be considered part of the substrate 220. The flexible connection 206 includes at least one dielectric layer 260 and at least one interconnect 262. The at least one dielectric layer 260 may be part of the at least one dielectric layer 221 of the substrate 220. The at least one interconnect 262 may be coupled to the plurality of interconnects 223. The at least one dielectric layer 260 and the at least one interconnect 262 may be flexible and/or bendable.

Figure 4:
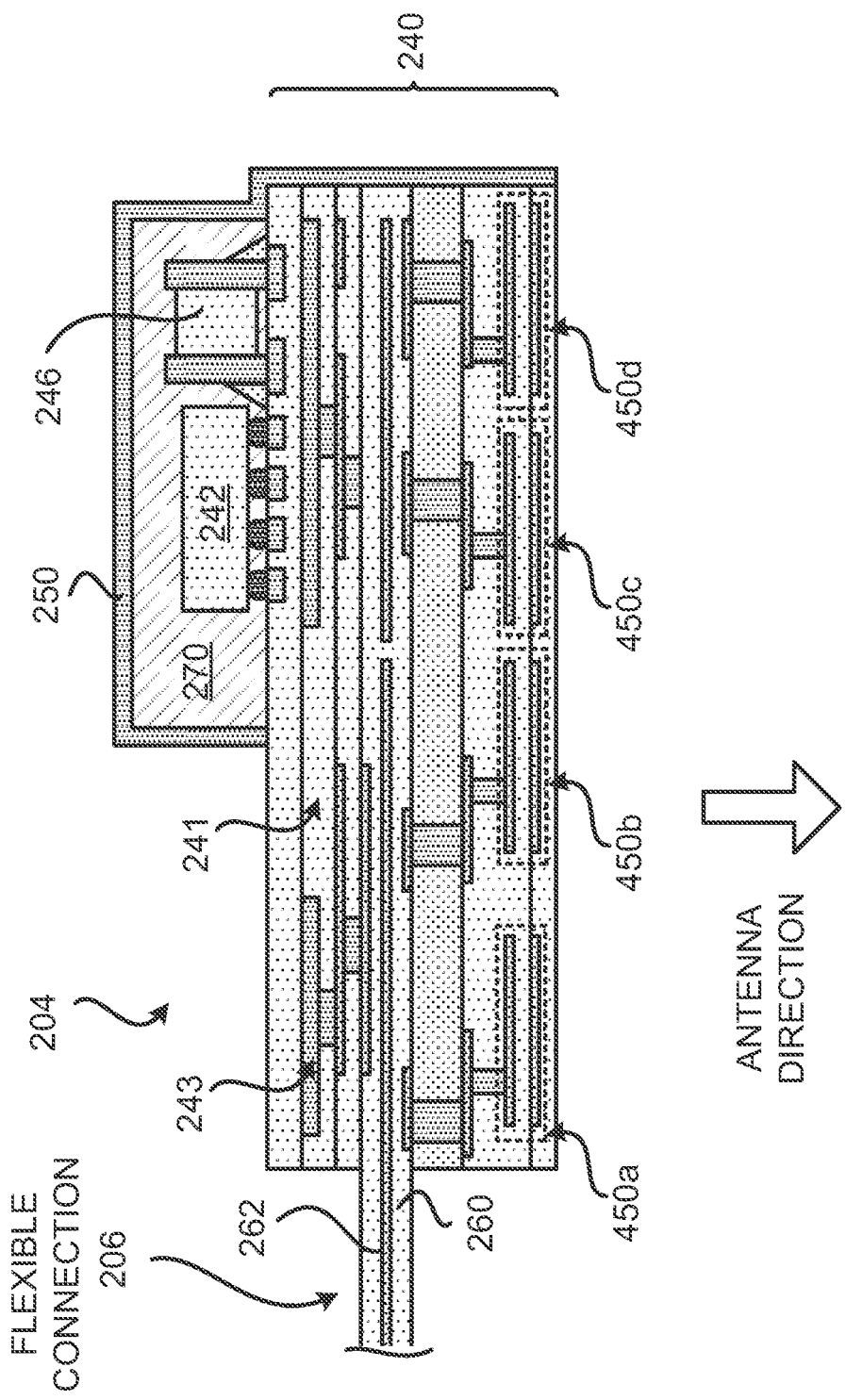
FIG. 4 illustrates a profile view of an exemplary second substrate comprising a flexible connection and an embedded antenna.

FIG. 4 illustrates a profile close up view of the package 204 of the device 200. As shown in FIG. 4, the package 204 includes the substrate 240, the integrated device 242, the passive device 246, the encapsulation layer 270, and the shield 250. The substrate 240 includes one or more dielectric layers 241 and a plurality of interconnects 243 (e.g., traces, pads, vias). The substrate 240 includes a first surface (e.g., top surface) and a second surface (e.g., bottom surface). The integrated device 242 and the passive device 246 are coupled to the first surface of the substrate 240. The encapsulation layer 270 is located over the first surface of the substrate 240, such that the encapsulation layer 270 encapsulates the integrated device 242 and the passive device 246. The encapsulation layer 270 may include a mold, a resin and/or an epoxy. The encapsulation layer 270 may be means for encapsulation. The shield 250 is located and formed over the outer surface of the encapsulation layer 270 and one or more surfaces of the substrate 240. For example, the shield 250 may be formed and located over the first surface and/or a side surface of the substrate 240. The shield 250 includes an electromagnetic interference (EMI) shield. The shield 250 may be means for shielding (e.g., means for EMI shielding).

As mentioned above, the substrate 240 includes a plurality of interconnects 243, where some of the interconnects may be configured to operate as one or more antennas. FIG. 4 illustrates antennas (e.g., 450*a*, 450*b*, 450*c*, 450*d*) formed in the substrate 240. The antennas (e.g., 450*a*, 450*b*, 450*c*, 450*d*) may be embedded antennas that are formed based on interconnects from the plurality of interconnects 243. The antennas (e.g., 450*a*, 450*b*, 450*c*, 450*d*) may be located (e.g., embedded) in the substrate 240 such that the antennas (e.g., 450*a*, 450*b*, 450*c*, 450*d*) face towards the second surface (e.g., bottom surface) of the substrate 240. The direction in which the second surface of the substrate 240 faces may be considered the antenna direction (e.g., second antenna direction) for the antennas (e.g., 450*a*, 450*b*, 450*c*, 450*d*). The antennas (e.g., 450*a*, 450*b*, 450*c*, 450*d*) may be electrically coupled to one or more of the integrated devices (e.g., 222, 224, 242) through the plurality of interconnects 243.

FIG. 4 also illustrates the flexible connection 206 coupled to the substrate 240. The flexible connection 206 may be embedded in the substrate 240. The flexible connection 206 may be considered part of the substrate 240. The flexible connection 206 includes at least one dielectric layer 260 and at least one interconnect 262. The at least one dielectric layer 260 may be part of the at least one dielectric layer 241 of the substrate 240. The at least one interconnect 262 may be coupled to the plurality of interconnects 243.

As will be further described below, the substrate 220 and/or the substrate 240 may include interconnects that are configured as external input/output (I/O) terminals, which allow the substrate 220 and/or the substrate 240 to be coupled to external components. Moreover, as will be further described below, the substrate 220, the substrate 240 and the flexible connection 206 may be fabricated concurrently as part of the same substrate.

Having described an example of a device that includes substrates with multi-directional antennas, various other examples of devices that include substrates with multi-directional antennas are further illustrated and described below.

Figure 5:
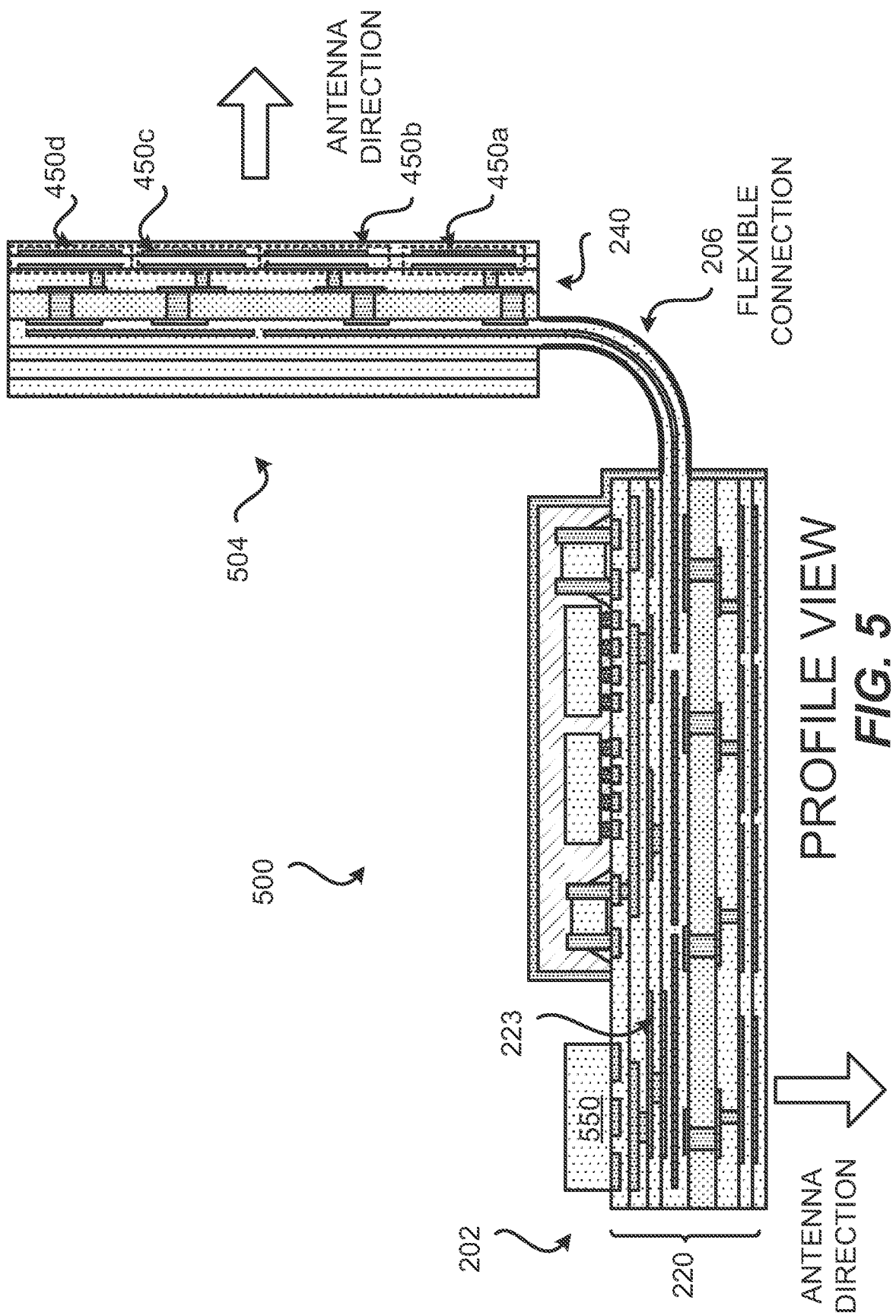
FIG. 5 illustrates a profile view of an exemplary device that includes substrates each having an embedded antenna, where the substrates are coupled through a flexible connection.

Exemplary Devices Comprising Substrates with Multi-Directional Antennas and Flexible Connection FIG. 5 illustrates a profile view of a device 500 that includes the package 202, the package 504, and the flexible connection 206. The package 202 and the flexible connection 206 of the device 500 are similar to the package 202 and the flexible connection 206 of the device 200, and thus may include similar components as the package 202 and the flexible connection 206 of the device 200. The package 202 of the device 500 includes a connector 550 that is coupled to the substrate 220. The connector 550 may be coupled to the plurality of interconnects 223. The connector 550 may be configured as external input/output (I/O) terminals for the package 202.

FIG. 5 illustrates the package 504 is coupled to the package 202 through the flexible connection 206. The package 504 is similar to the package 204 of the device 200, and thus may include similar components as the package 204 of the device 200. One difference between the package 504 and the package 204 is that the package 504 does not include an integrated device. The package 504 includes the substrate 240 and antennas (e.g., 450*a*, 450*b*, 450*c*, 450*d*). The antennas (e.g., 450*a*, 450*b*, 450*c*, 450*d*) may be coupled (e.g., electrically coupled) to the package 202 through the flexible connection 206.

Figure 6:
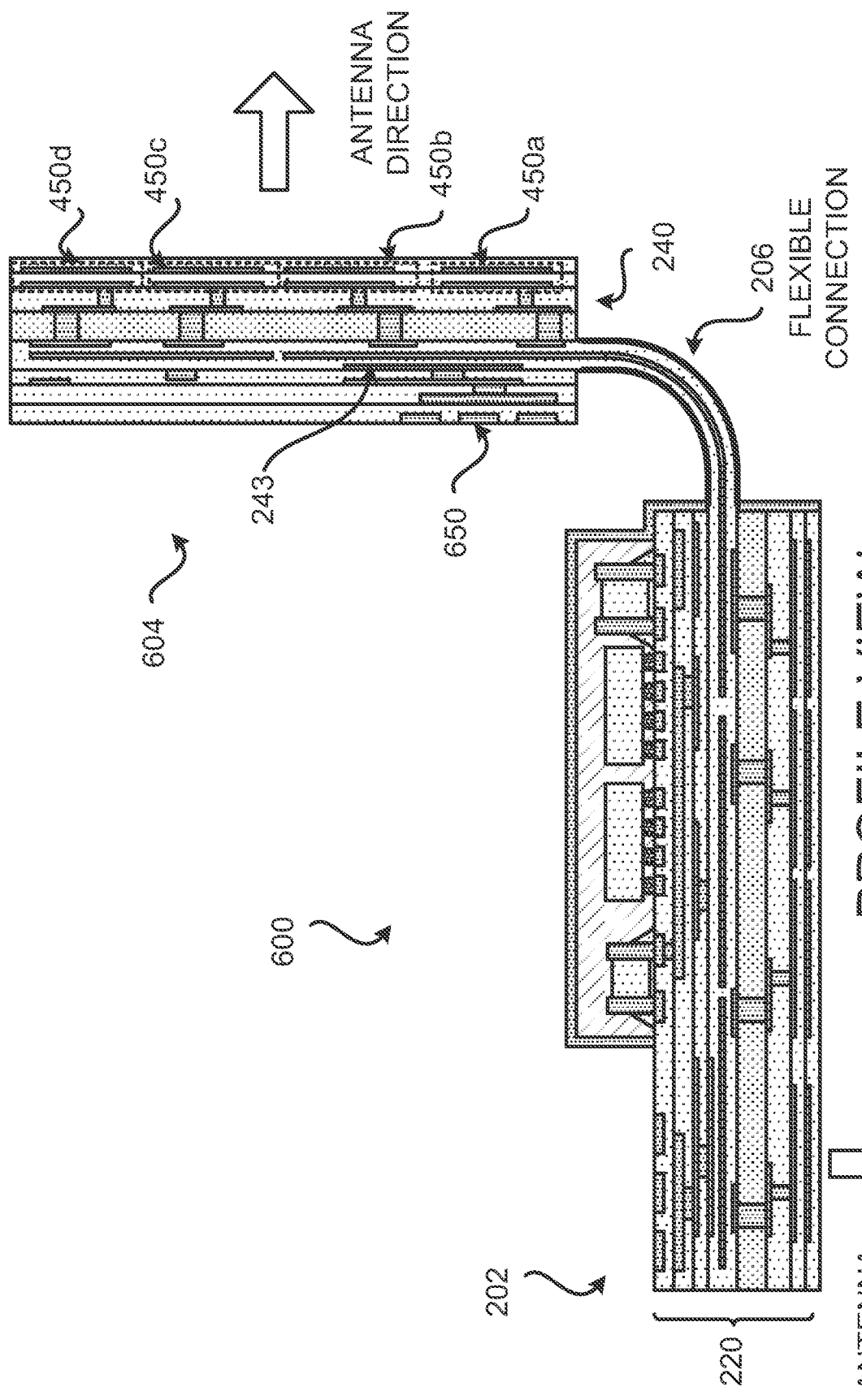
FIG. 6 illustrates a profile view of an exemplary device that includes substrates each having an embedded antenna, where the substrates are coupled through a flexible connection.

FIG. 6 illustrates a profile view of a device 600 that includes the package 202, the package 604, and the flexible connection 206. The package 202 and the flexible connection 206 of the device 600 are similar to the package 202 and the flexible connection 206 of the device 200, and thus may include similar components as the package 202 and the flexible connection 206 of the device 200.

FIG. 6 illustrates the package 604 is coupled to the package 202 through the flexible connection 206. The package 604 is similar to the package 204 of the device 200, and thus may include similar components as the package 204 of the device 200. One difference between the package 604 and the package 204 is that the package 604 does not include an integrated device. The package 604 includes the substrate 240 and antennas (e.g., 450a, 450b, 450c, 450d). The antennas (e.g., 450a, 450b, 450c, 450d) may be coupled (e.g., electrically coupled) to the package 202 through the flexible connection 206. The substrate 240 of the package 604 also includes a plurality of interconnects 650 (e.g., land pad array) that is configured as external input/output (I/O) terminals for the substrate 240. Thus, in some implementations, the antennas (e.g., (e.g., 450a, 450b, 450c, 450d) may be coupled to external components (e.g., integrated devices) through the plurality of interconnects 650. The plurality of interconnects 650 may be considered part of the plurality of interconnects 243.

Figure 7:
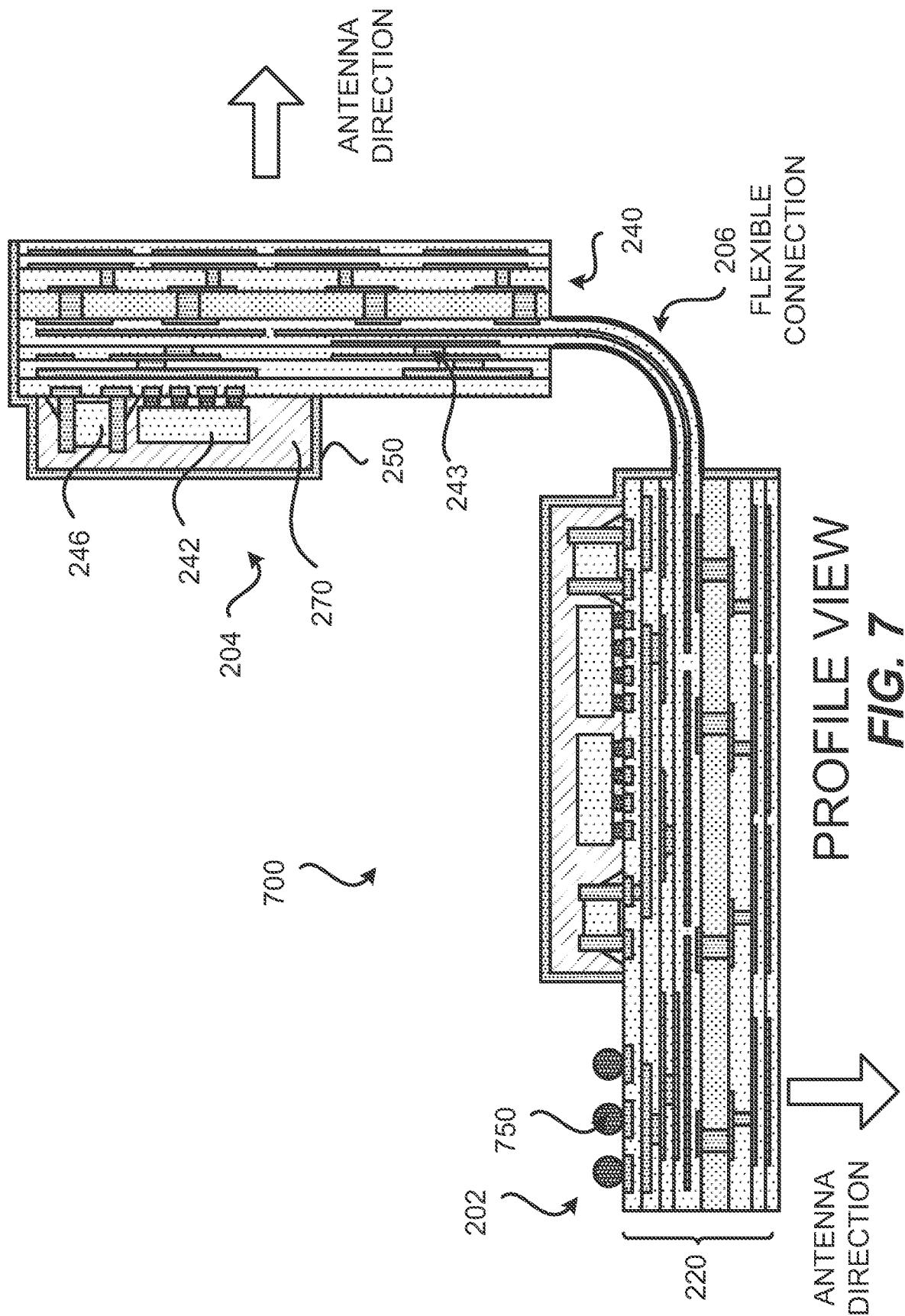
FIG. 7 illustrates a profile view of an exemplary device that includes substrates each having an embedded antenna, where the substrates are coupled through a flexible connection.

FIG. 7 illustrates a profile view of a device 700 that includes the package 202, the package 204, and the flexible connection 206. The package 202 and the flexible connection 206 of the device 700 are similar to the package 202 and the flexible connection 206 of the device 200, and thus may include similar components as the package 202 and the flexible connection 206 of the device 200. The package 202 includes a plurality of solder interconnects 750 that is coupled to the plurality of interconnects 223. The plurality of solder interconnects 750 may enable the package 202 to be coupled to external components.

Figure 8:
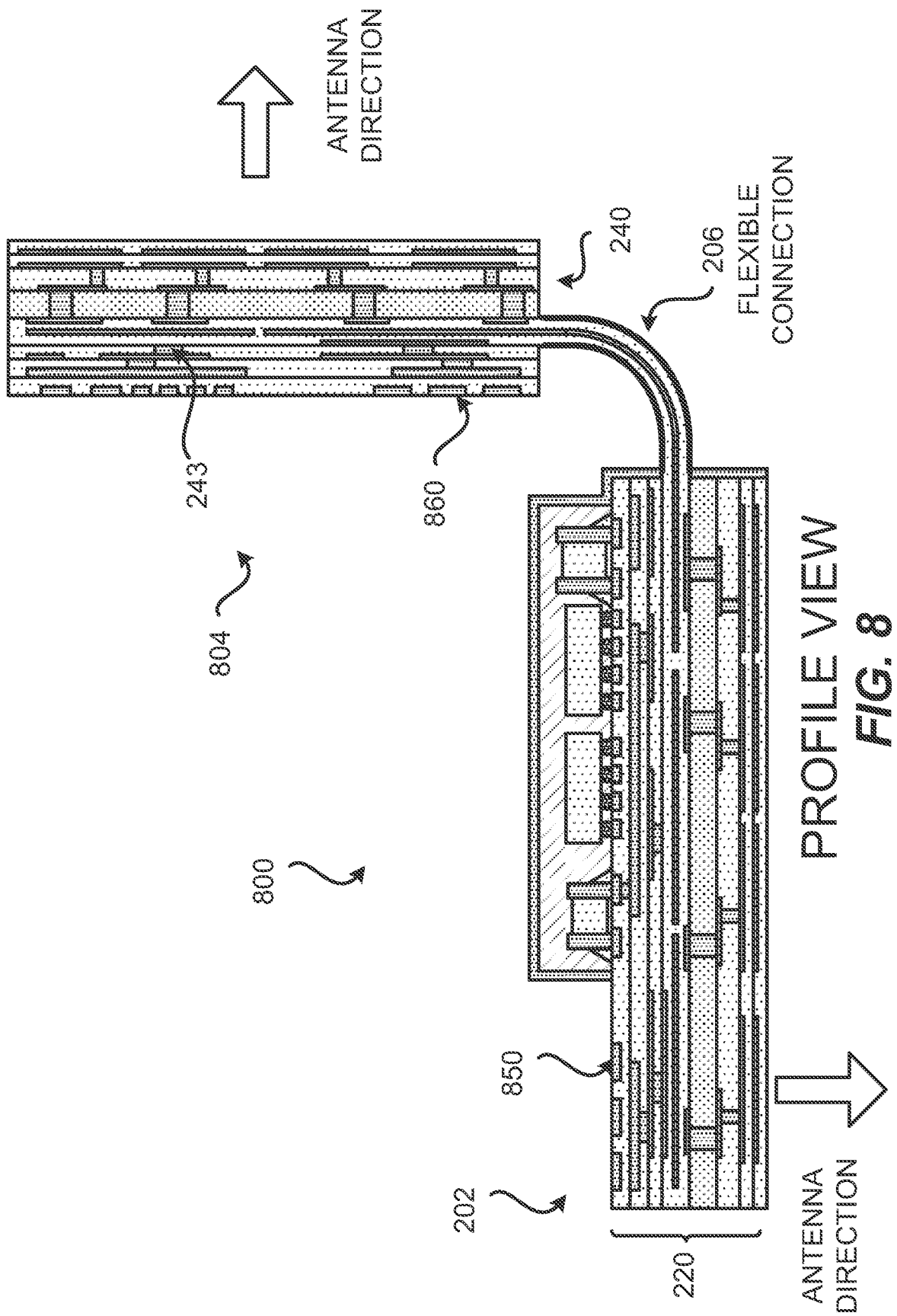
FIG. 8 illustrates a profile view of an exemplary device that includes substrates each having an embedded antenna, where the substrates are coupled through a flexible connection.

FIG. 8 illustrates a profile view of a device 800 that includes the package 202, the package 804, and the flexible connection 206. The package 202 and the flexible connection 206 of the device 800 are similar to the package 202 and the flexible connection 206 of the device 200, and thus may include similar components as the package 202 and the flexible connection 206 of the device 200. The package 202 includes a plurality of interconnects 850 (e.g., landing pad array) that is coupled to the plurality of interconnects 223. The plurality of interconnects 850 may enable the package 202 to be coupled to external components. The plurality of interconnects 850 may be considered part of the plurality of interconnects 223.

FIG. 8 illustrates the package 804 is coupled to the package 202 through the flexible connection 206. The package 804 is similar to the package 204 of the device 200, and thus may include similar components as the package 204 of the device 200. The package 804 includes a plurality of interconnects 860 (e.g., landing pad array) that is coupled to the plurality of interconnects 243. The plurality of interconnects 860 may enable the package 804 to be coupled to external components.

Figure 9:
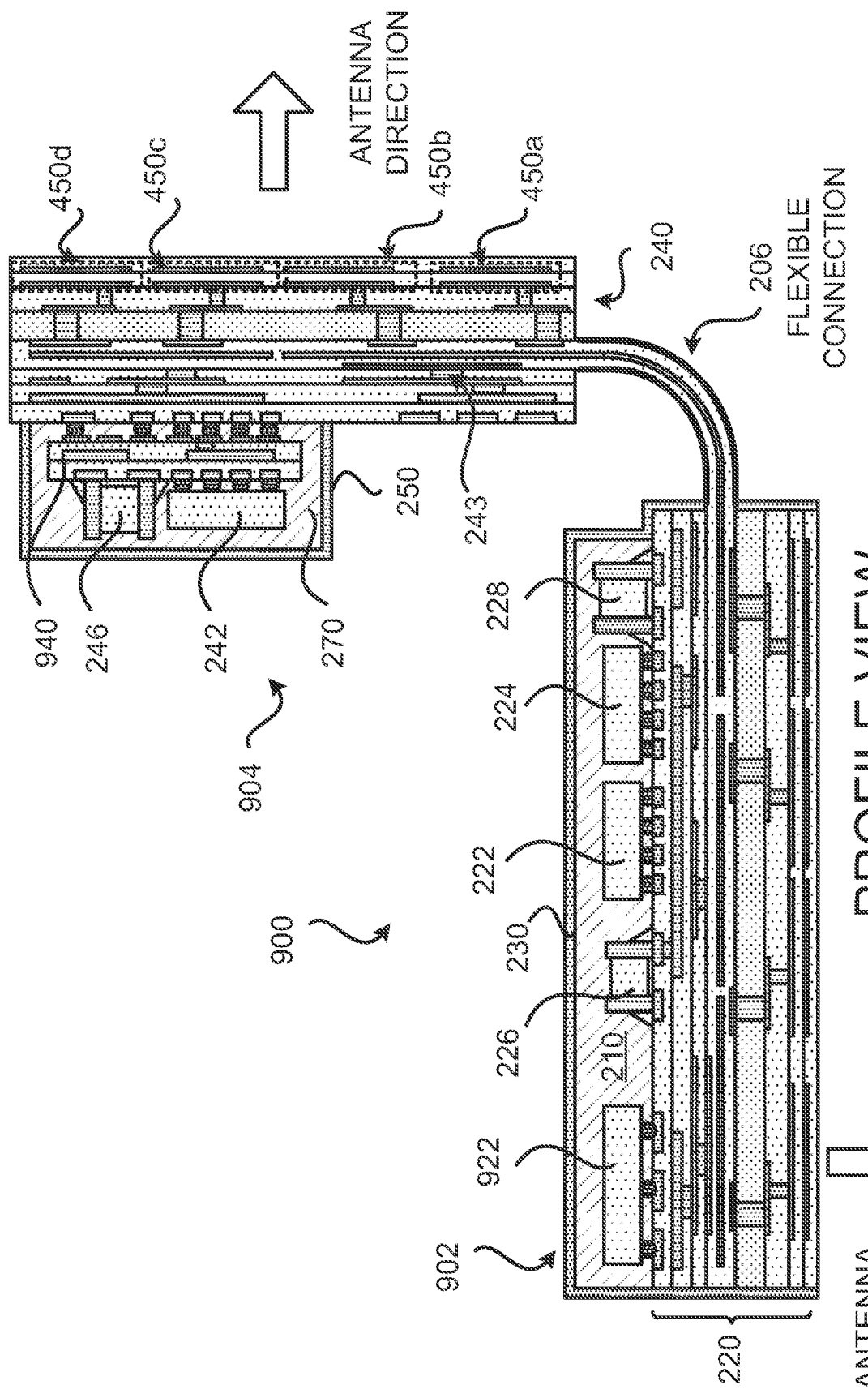
FIG. 9 illustrates a profile view of an exemplary device that includes substrates each having an embedded antenna, where the substrates are coupled through a flexible connection.

FIG. 9 illustrates a profile view of a device 900 that includes the package 902, the package 904, and the flexible connection 206. The package 902 and the flexible connection 206 of the device 900 are similar to the package 202 and the flexible connection 206 of the device 200, and thus may include similar components as the package 202 and the flexible connection 206 of the device 200. The package 902 includes integrated devices (e.g., 222, 224, 922) and passive devices (e.g., 226, 228) that are coupled to the substrate 220. The encapsulation layer 210 may be located over substantially the first surface of the substrate 220. The encapsulation layer 210 may encapsulate the integrated devices (e.g., 222, 224, 922) and the passive devices (e.g., 226, 228). The shield 230 may be formed over the outer surface of the encapsulation layer 210 and portions of the substrate 220.

FIG. 9 illustrates the package 904 is coupled to the package 902 through the flexible connection 206. The package 904 is similar to the package 204 of the device 200, and thus may include similar components as the package 204 of the device 200. The package 904 includes the substrate 240, a substrate 940, the integrated device 242, the passive device 246, the encapsulation layer 270 and the shield 250. The integrated device 242 and the passive device 246 are coupled to the substrate 940. The substrate 940 may include one or more dielectric layers and a plurality of interconnects. The integrated device 242 and the passive device 246 are coupled to the substrate 240 through the substrate 940. The encapsulation layer 270 may encapsulate the integrated device 242, the passive device 246, and the substrate 940. The shield 250 may be located over the outer surface of the encapsulation layer 270.

Figure 10:
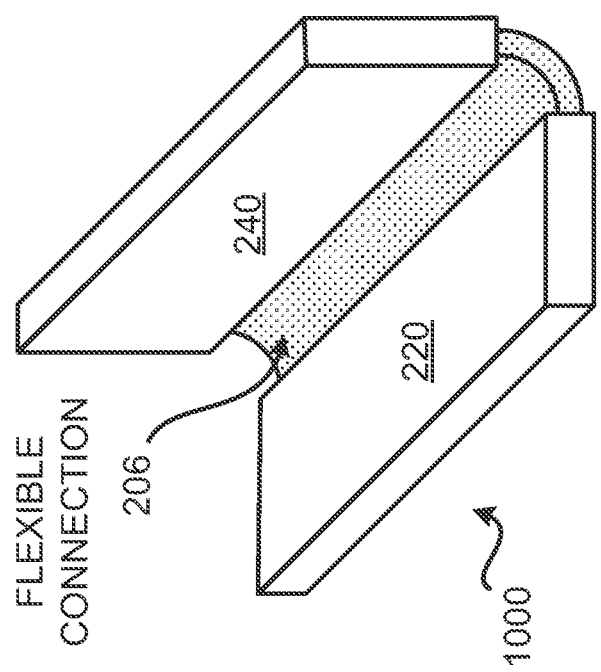
FIG. 10 illustrates a view of an exemplary configuration of a first substrate coupled to a second substrate through a flexible connection.

Different implementations may couple the substrates through the flexible connection 206 differently. FIGS. 10-15 illustrate various configurations and arrangements of substrates coupled through flexible connections. FIG. 10 illustrates an example of a device 1000 that includes the substrate 220, the substrate 240 and the flexible connection 206, where the substrate 220 and the substrate 240 are coupled to the flexible connection 206 along the length of the substrate 220 and the length of the substrate 240.

Figure 11:
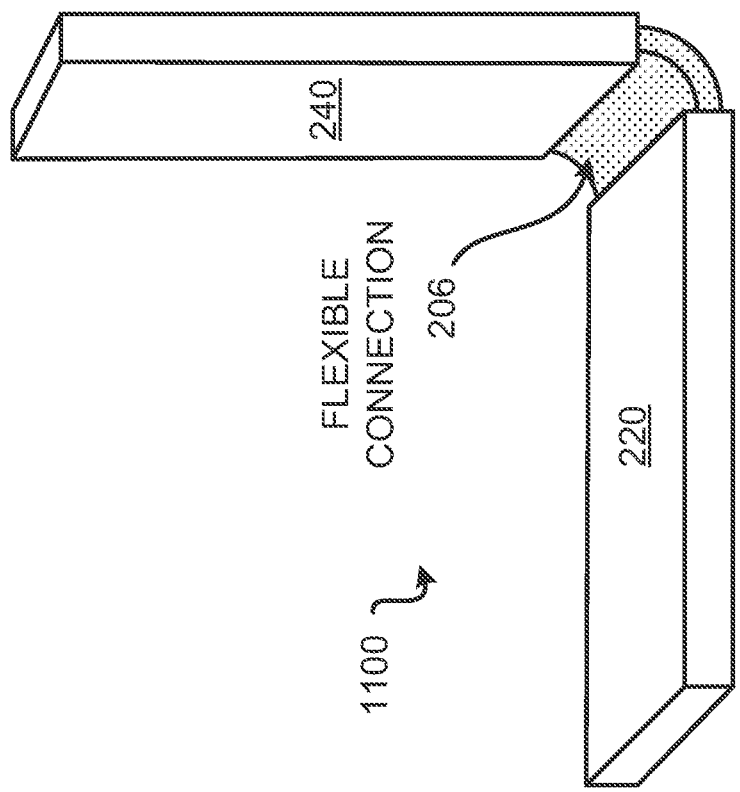
FIG. 11 illustrates a view of an exemplary configuration of a first substrate coupled to a second substrate through a flexible connection.

FIG. 11 illustrates an example of a device 1100 that includes the substrate 220, the substrate 240 and the flexible connection 206, where the substrate 220 and the substrate 240 are coupled to the flexible connection 206 along the width of the substrate 220 and the width of the substrate 240. The flexible connection 206 may be considered part of the substrate 220 and the substrate 240.

Figure 12:
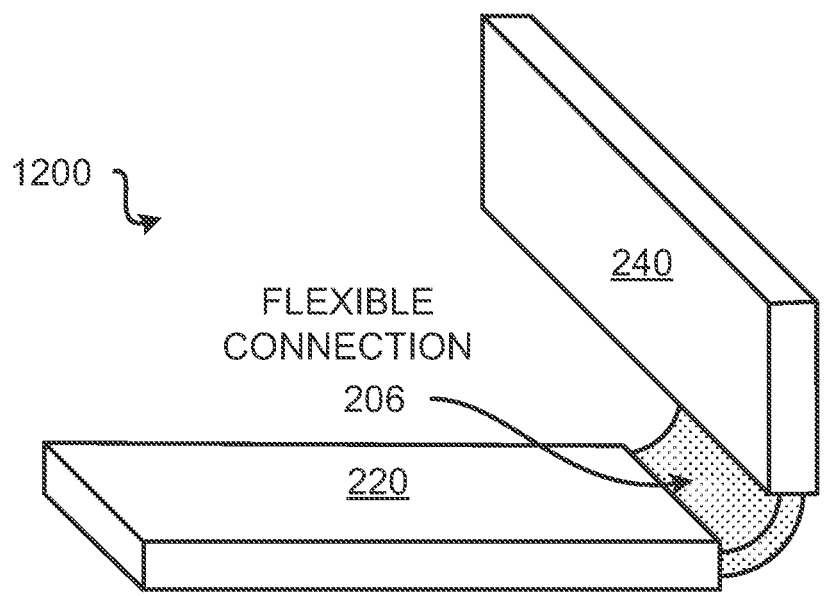
FIG. 12 illustrates a view of an exemplary configuration of a first substrate coupled to a second substrate through a flexible connection.

FIG. 12 illustrates an example of a device 1200 that includes the substrate 220, the substrate 240 and the flexible connection 206, where the substrate 220 and the substrate 240 are coupled to the flexible connection 206 along the width of the substrate 220 and the length of the substrate 240.

Figure 13:
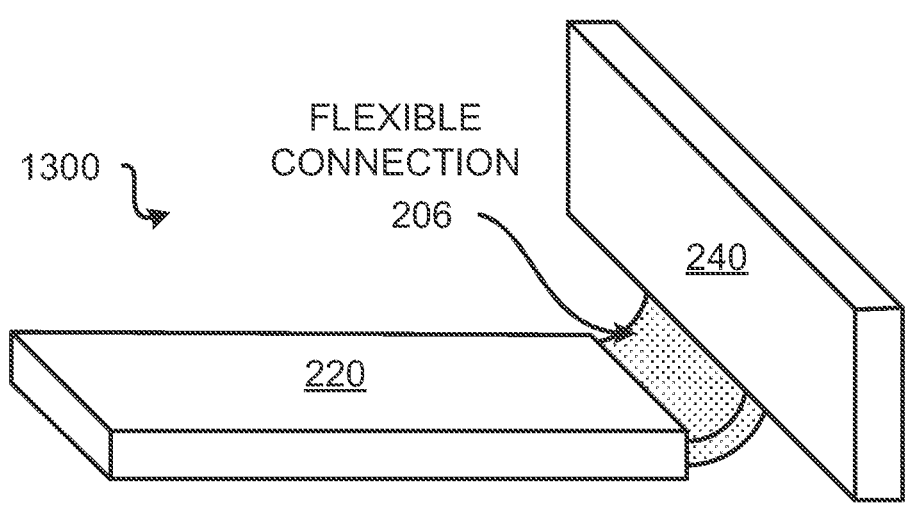
FIG. 13 illustrates a view of an exemplary configuration of a first substrate coupled to a second substrate through a flexible connection.

FIG. 13 illustrates an example of a device 1300 that includes the substrate 220, the substrate 240 and the flexible connection 206, where the substrate 220 and the substrate 240 are coupled to the flexible connection 206 along the width of the substrate 220 and the length of the substrate 240, such that the substrate 220 and the substrate 240 form a T shape.

Figure 14:
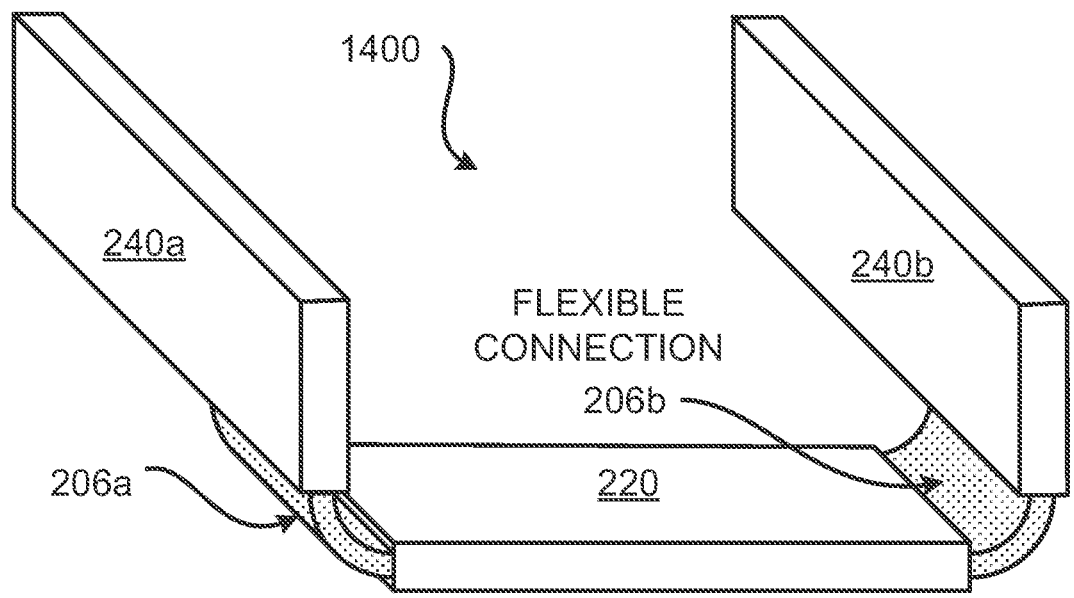
FIG. 14 illustrates a view of an exemplary configuration of a first substrate coupled to a second substrate through a flexible connection.

In some implementations, more than two substrates may be coupled together through several flexible connections. FIG. 14 illustrates an example of a device 1400 that includes the substrate 220, the substrate 240a, the substrate 240b, the flexible connection 206a and the flexible 206b, where the substrate 220 and the substrate 240a are coupled to the flexible connection 206a along the width of a first side of the substrate 220 and the length of the substrate 240a. In addition, the substrate 220 and the substrate 240b are coupled to the flexible connection 206b along the width of a second side of the substrate 220 and the length of the substrate 240b. The flexible connection 206a may be considered part of the substrate 220 and the substrate 240a. The flexible connection 206b may be considered part of the substrate 220 and the substrate 240b.

Figure 15:
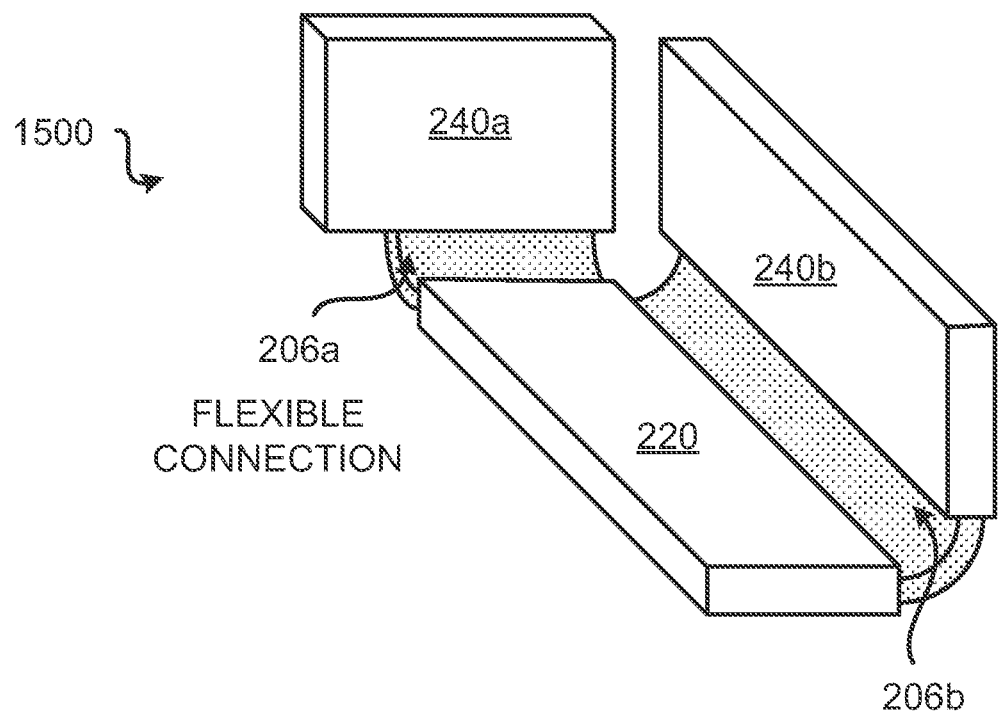
FIG. 15 illustrates a view of an exemplary configuration of a first substrate coupled to a second substrate through a flexible connection.

FIG. 15 illustrates an example of a device 1500 that includes the substrate 220, the substrate 240a, the substrate 240b, the flexible connection 206a and the flexible 206b, where the substrate 220 and the substrate 240a are coupled to the flexible connection 206a along the width of a first side of the substrate 220 and the length of the substrate 240a. In addition, the substrate 220 and the substrate 240b are coupled to the flexible connection 206b along the length of a second side of the substrate 220 and the length of the substrate 240b. The flexible connection 206a may be considered part of the substrate 220 and the substrate 240a. The flexible connection 206b may be considered part of the substrate 220 and the substrate 240b.

Different implementations may use substrates with different sizes and shapes. Different implementations may include a different number of substrates, a different number of flexible connections, that are coupled along different surfaces of the substrates. The relative angles between the different substrates may vary and is not limited to perpendicular angles. The relative locations and/or angles between substrates may be in a range of 0-360 degrees. Thus, the positions, shapes, sizes, angles of the substrates that are shown are merely exemplary. Moreover, various components (e.g., integrated device, passive device), encapsulation layer(s) and/or shield(s) may be coupled to and/or formed over the substrates.

Having described various configurations and arrangements of devices that include multi-directional antennas, a sequence for fabricating a device that includes multi-directional antennas will be further described below.

Exemplary Sequence for Fabricating a Device Comprising Substrates with Multi-Directional Antennas and Flexible Connection FIG. 16 (which includes FIGS. 16A-16F) illustrates an exemplary sequence for providing or fabricating a device that includes several substrates with multi-directional antennas. In some implementations, the sequence of FIGS. 16A-16F may be used to provide or fabricate the device 200 of FIG. 2, or any of the devices (e.g., 500, 600, 700, 800, 900, 1000, 1100, 1200, 1300, 1400, 1500) described in the disclosure.

It should be noted that the sequence of FIGS. 16A-16F may combine one or more stages in order to simplify and/or clarify the sequence for providing or fabricating the device. In some implementations, the order of the processes may be changed or modified. In some implementations, one or more of processes may be replaced or substituted without departing from the spirit of the disclosure.

Figure 16A:
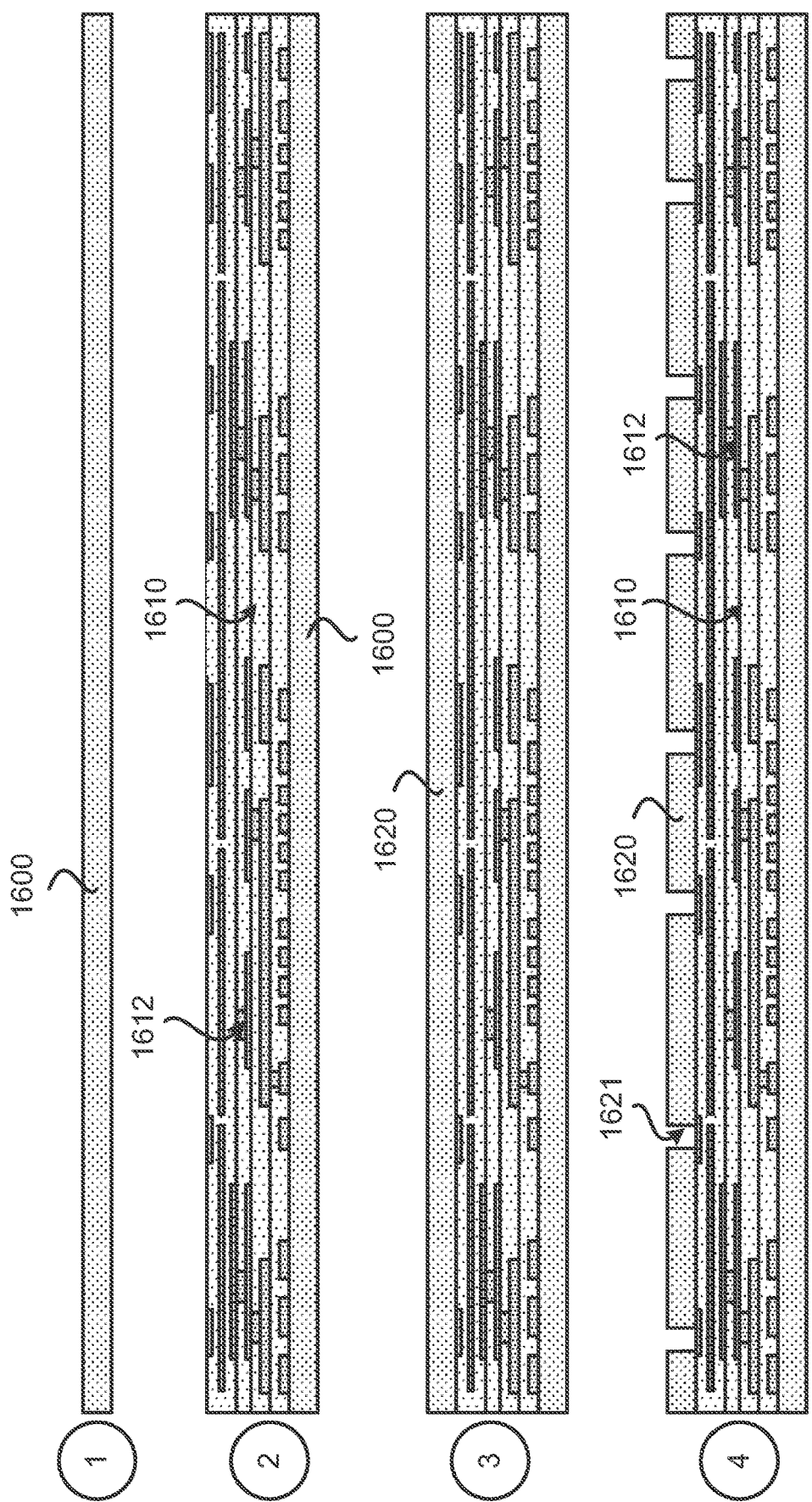
FIG. 16 (comprising FIGS. 16A-16F) illustrates an exemplary sequence for fabricating a device that includes several substrates each having an embedded antenna.

Stage 1, as shown in FIG. 16A, illustrates a state after a carrier 1600 is provided. The carrier 1600. The carrier 1600 may include a tape, a wafer and/or a substrate.

Stage 2 illustrates a state after several dielectric layers 1610 and a plurality of interconnects 1612 (e.g., traces, pads, vias) are formed over the carrier 1600. A deposition process may be used to form the dielectric layers 1610. Forming the plurality of interconnects 1612 may include forming a seed layer, performing a lithography process, a plating process, a stripping process and/or an etching process. In some implementations, the deposition, the lithography process, the plating process, the stripping process and/or the etching process may be performing iteratively.

Stage 3 illustrates a state after a dielectric layer 1620 is formed over the dielectric layer 1610 and the plurality of interconnects 1612. A deposition process may be used to form the dielectric layer 1620.

Stage 4 illustrates a state after cavities 1621 are formed in the dielectric layer 1620. An etching process may be used to form the cavities.

Figure 16B:
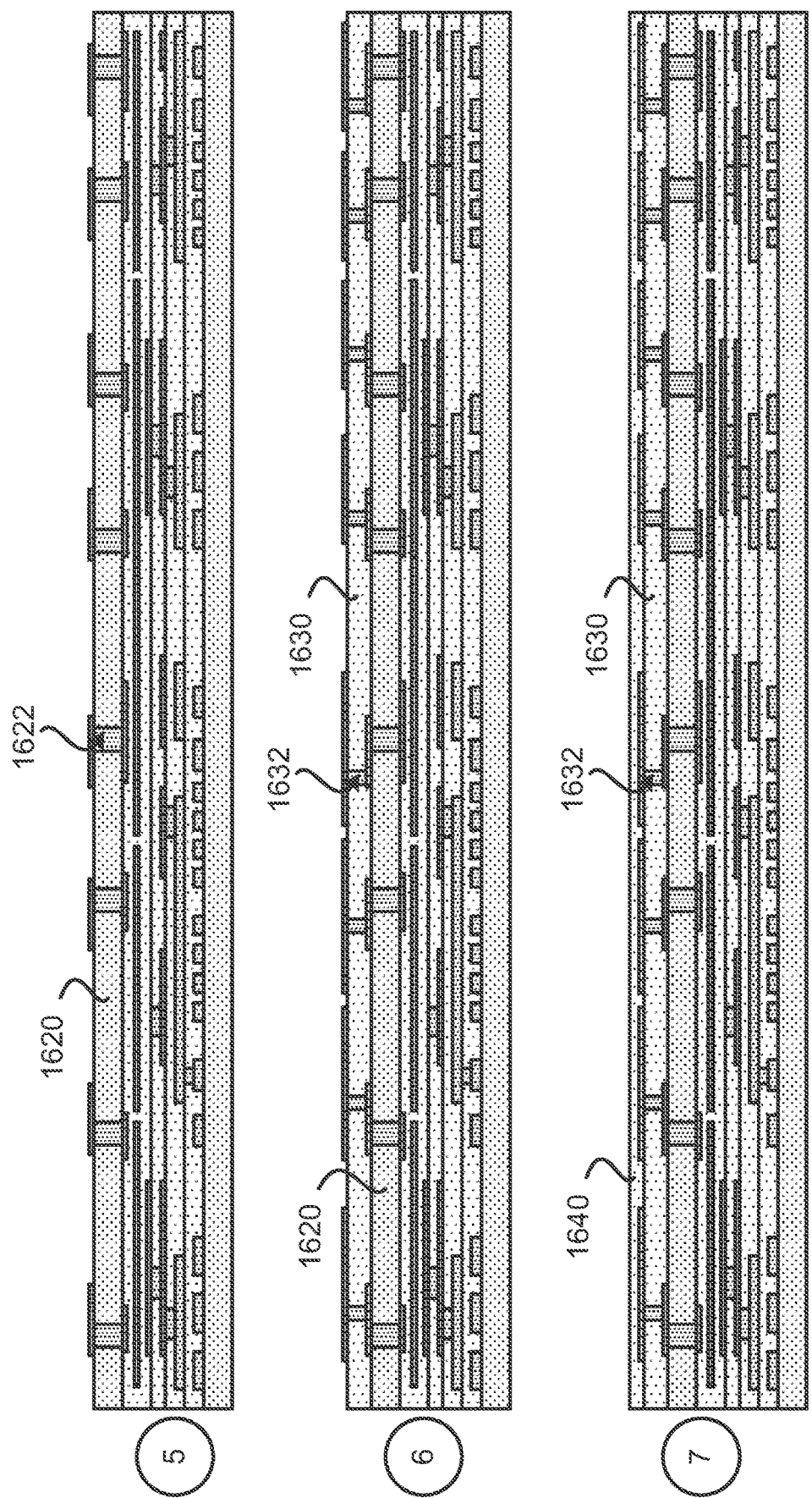

Stage 5, as shown in FIG. 16B, illustrates a state after a plurality of interconnects 1622 are formed over the cavities 1621 and the dielectric layer 1620. The plurality of interconnects 1622 may include traces, pads, and/or vias. Forming the plurality of interconnects 1622 may include forming a seed layer, performing a lithography process, a plating process, a stripping process and/or an etching process.

Stage 6 illustrates a state after a dielectric layer 1630 and a plurality of interconnects 1632 are formed over the dielectric layer 1620 and the plurality of interconnects 1622. A deposition process may be used to form the dielectric layer 1630. Forming the plurality of interconnects 1632 may include forming a seed layer, performing a lithography process, a plating process, a stripping process and/or an etching process.

Stage 7 illustrates a state after the dielectric layer 1640 is formed over the dielectric layer 1630. A deposition process may be used to form the dielectric layer 1640.

Figure 16C:
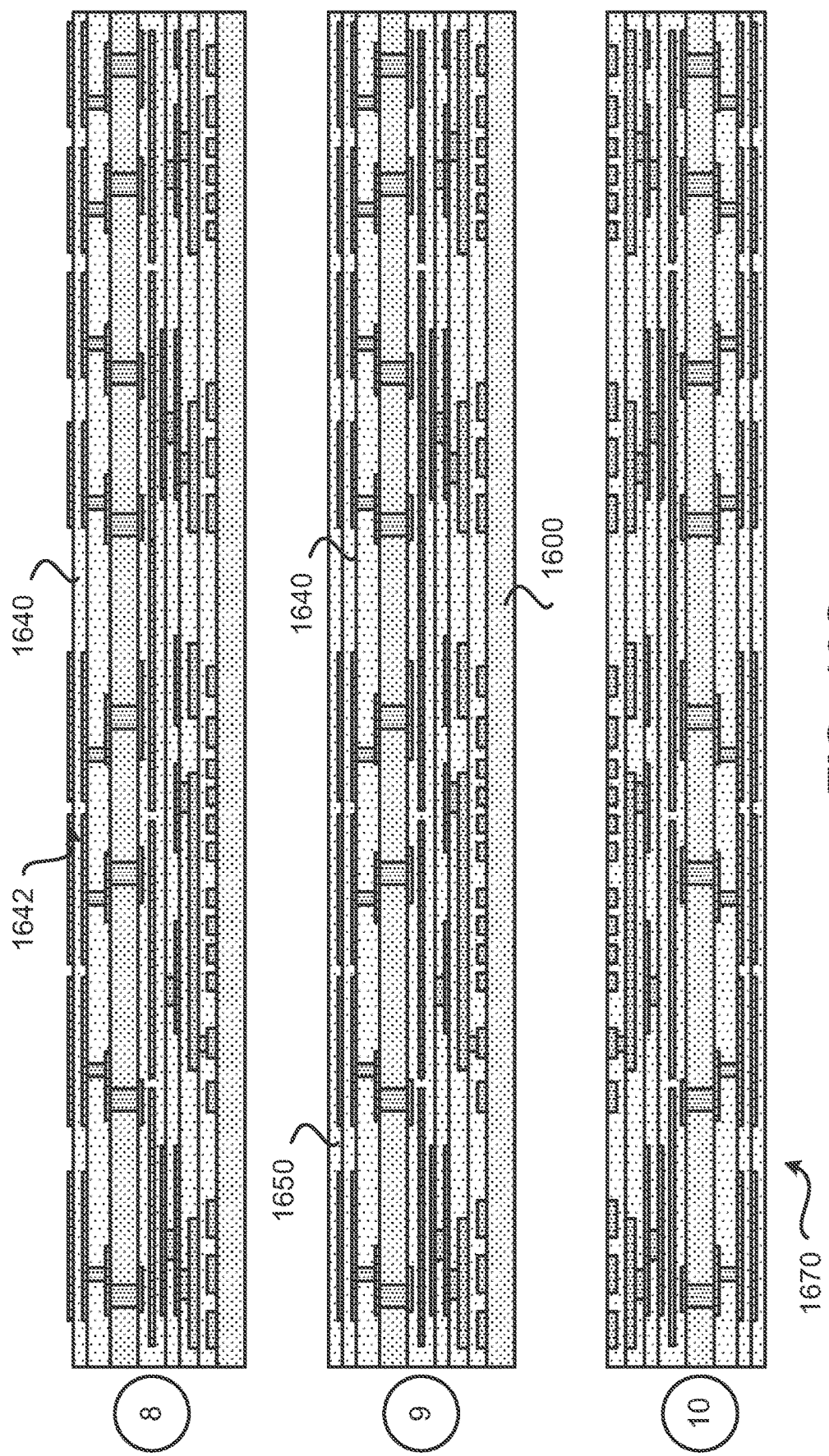

Stage 8, as shown in FIG. 16C, illustrates a state after a plurality of interconnects 1642 are formed over the dielectric layer 1640. Forming the plurality of interconnects 1642 may include forming cavities in the dielectric layer 1640. Forming the plurality of interconnects 1642 may include forming a seed layer, performing a lithography process, a plating process, a stripping process and/or an etching process. It is noted that some of interconnects from the plurality of interconnects 1642, 1632 and/or 1622 may be used to form antennas (e.g., 350a, 450a) for the substrate.

Stage 9 illustrates a state after the dielectric layer 1650 is formed over the dielectric layer 1640 and/or the plurality of interconnects 1642. A deposition process may be used to form the dielectric layer 1650.

Stage 10 illustrates a state after carrier 1600 is decoupled from the substrate 1670. The substrate 1670 may include the dielectric layers (e.g., 1610, 1620, 1630, 1640, 1650) and the plurality of interconnects (e.g., 1612, 1622, 1632, 1642). Examples of processes for fabricating the substrate 1670 includes a semi additive process (SAP) and a modified semi additive process (mSAP). However, different implementations may fabricate the substrate 1670 differently.

Figure 16D:
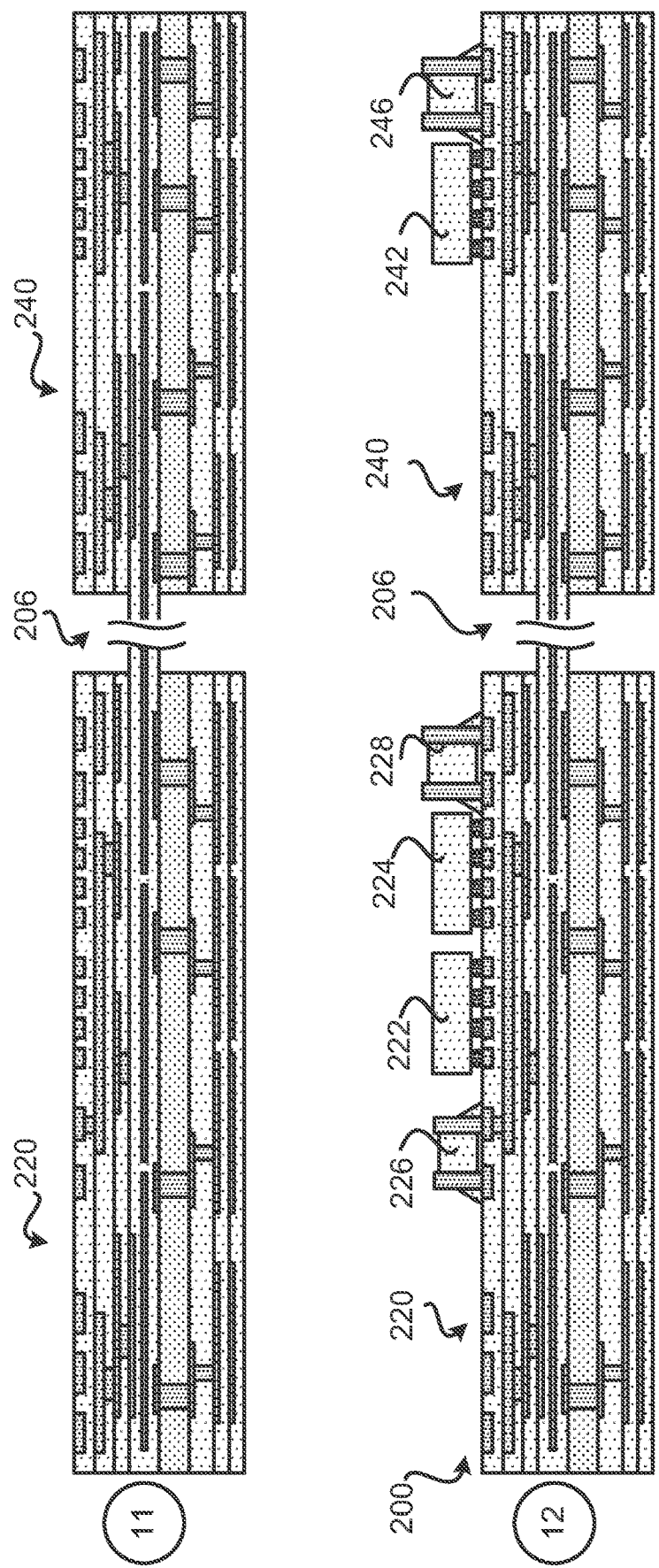

Stage 11, as shown in FIG. 16D, illustrates a state after a saw process is used to remove portions of the substrate 1670. An etching process, a mechanical process, and/or a laser process may be used to remove portions of the substrate 1670. Portions of the substrate 1670 that are removed may include one or more dielectric layers. The saw process may leave a portion of the substrate 1670, which exposes and/or defines the flexible connection 206. The flexible connection 206 may include at least one dielectric layer 260 and at least one interconnect 262. The at least one dielectric layer 260 may be formed from at least one of dielectric layers (e.g., 1610, 1620, 1630, 1640, 1650). The at least one interconnect 262 may be formed from at least one of the interconnects (e.g., 1612, 1622, 1632, 1642). The saw process may also define two substrates (e.g., substrate 220, substrate 240) which may be coupled together through the flexible connection 206.

Stage 12 illustrates a state after components are coupled to the substrate 1670. In particular, the integrated devices (e.g., 222, 224, 242) and the passive devices (e.g., 226, 228, 246) are coupled to a first surface of the substrate 1670. In some implementations, a pick and place operation may be used to couple the integrated devices and/or passive devices. The integrated devices and/or passive devices may be coupled to the substrates 220 and 240 through solder interconnects.

Figure 16E:
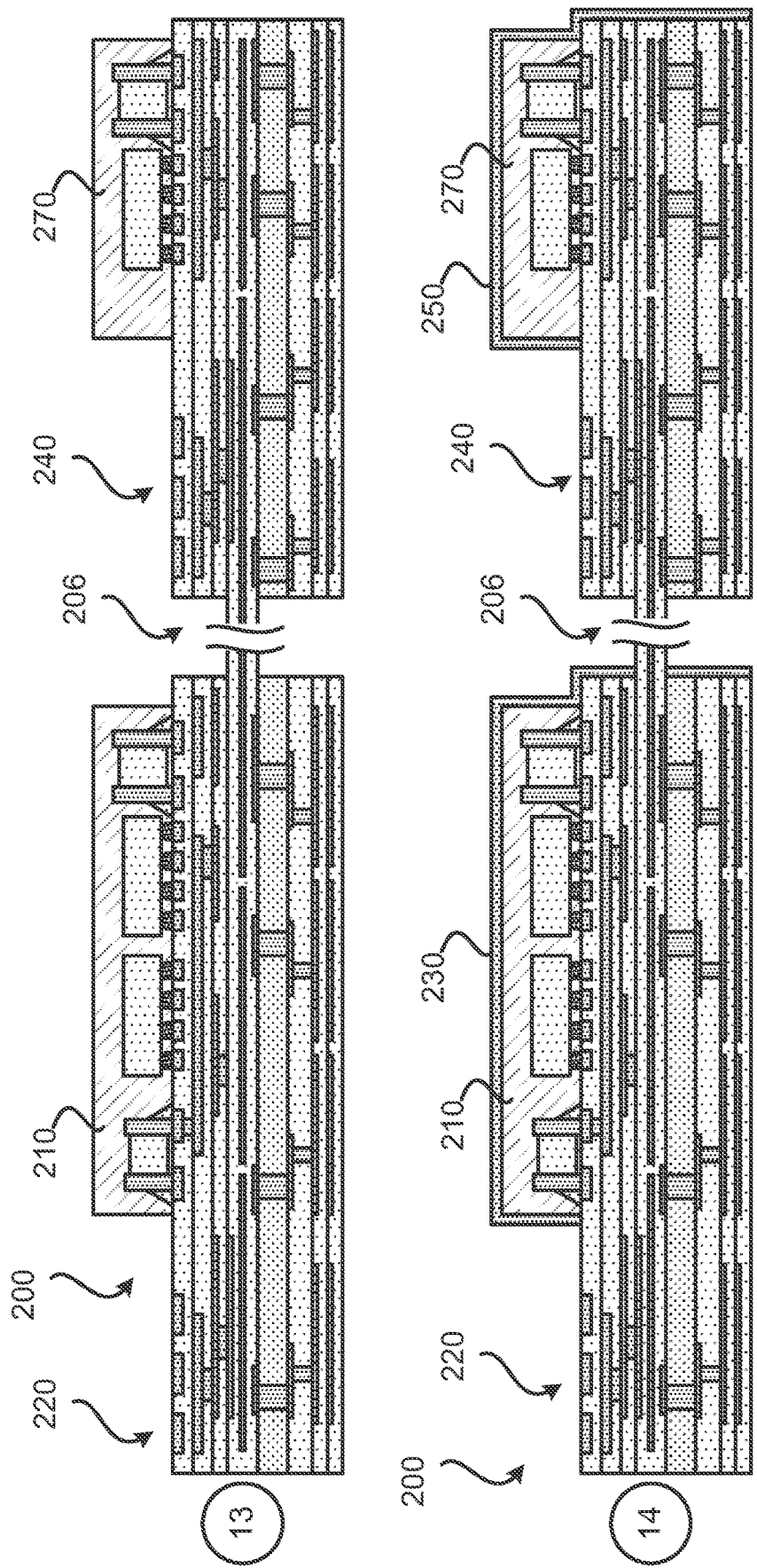

Stage 13, as shown in FIG. 16E, illustrates a state after an encapsulation layer 210 and an encapsulation layer 270 are formed over the integrated devices and passive devices. In some implementations, one encapsulation layer or separate encapsulation layers may be formed over the integrated devices and/or passive devices. The encapsulation layers 210 and 270 may be provided over the substrates 220 and 240 by using a compression and transfer molding process, a sheet molding process, or a liquid molding process. In some implementations, the encapsulation layer 210 and the encapsulation layer 270 may be considered part of the same encapsulation layer.

Stage 14 illustrates a state after the shield 230 and the shield 250 are formed. The shield 230 is formed over the encapsulation layer 210 coupled to the substrate 220. The shield 250 is formed over the encapsulation layer 270 coupled to the substrate 240. A sputtering process may be used to form the shield 230 and/or the shield 250. The shield 230 may be formed and located over the outer surface of the encapsulation layer 210 and/or the surface (e.g., side surface) of the substrate 220. The shield 250 may be formed and located over the outer surface of the encapsulation layer 270 and/or the surface (e.g., side surface) of the substrate 240. In some implementations, a protective material may be disposed or formed over the flexible connection 206.

Figure 16F:
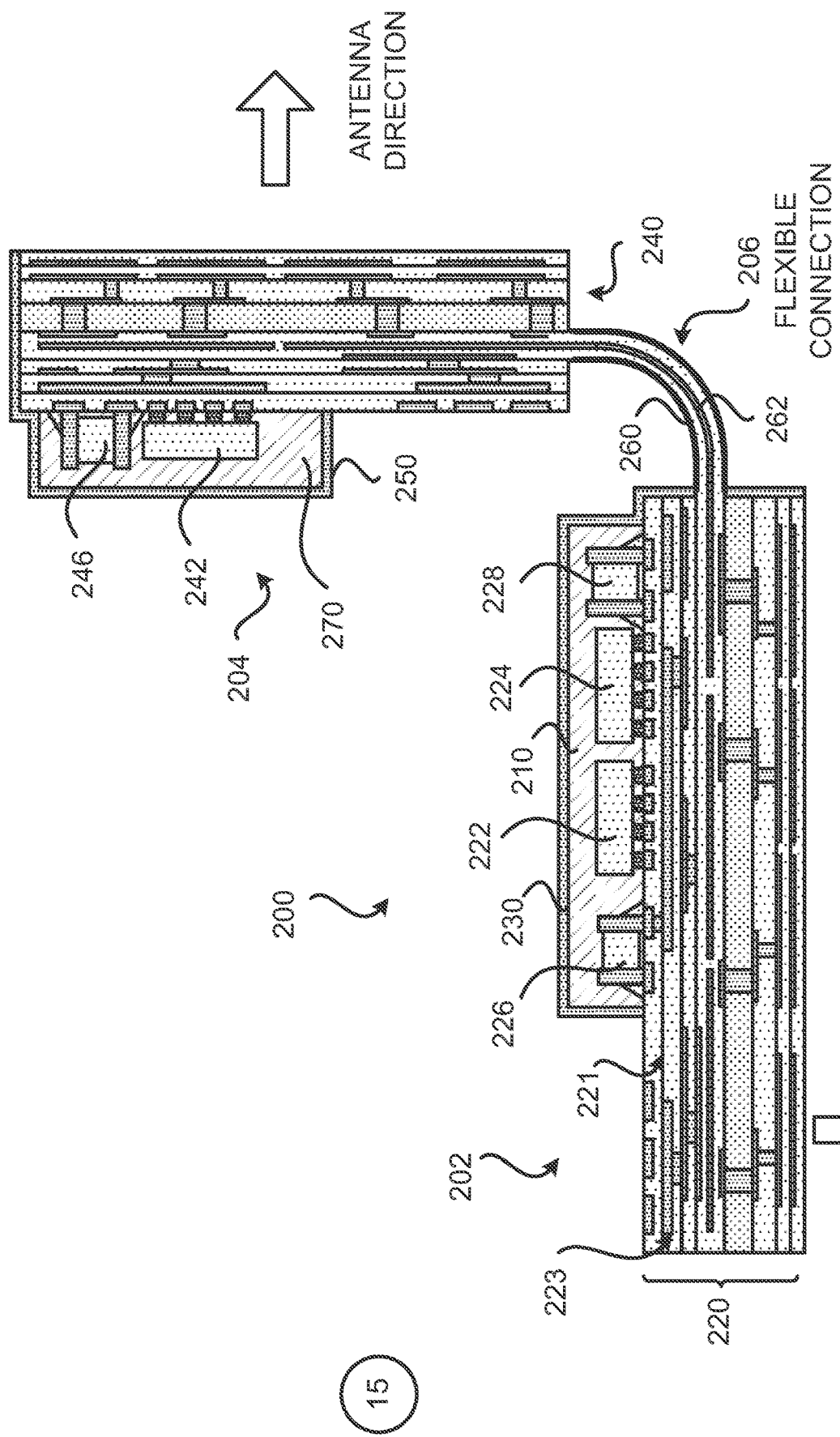

Stage 15, as shown in FIG. 16F, illustrates a state after the flexible connection 206 is bent so that the substrate 220 is aligned in such a way that the antenna direction for the substrate 220 and the antenna(s) in the substrate 220 faces a first direction (e.g., first antenna direction), and the substrate 240 is aligned in such a way that the antenna direction for the substrate 240 and the antenna(s) in the substrate 240 faces a second direction (e.g., second antenna direction) that is different than the first direction. It is noted that the flexible connection 206 may be flexible or bent in any number of ways, in any number of angles. It is noted that stages 13, 14 and/or 15 may illustrate the device 200 that includes the package 202, the package 204, and the flexible connection 206.

Figure 17:
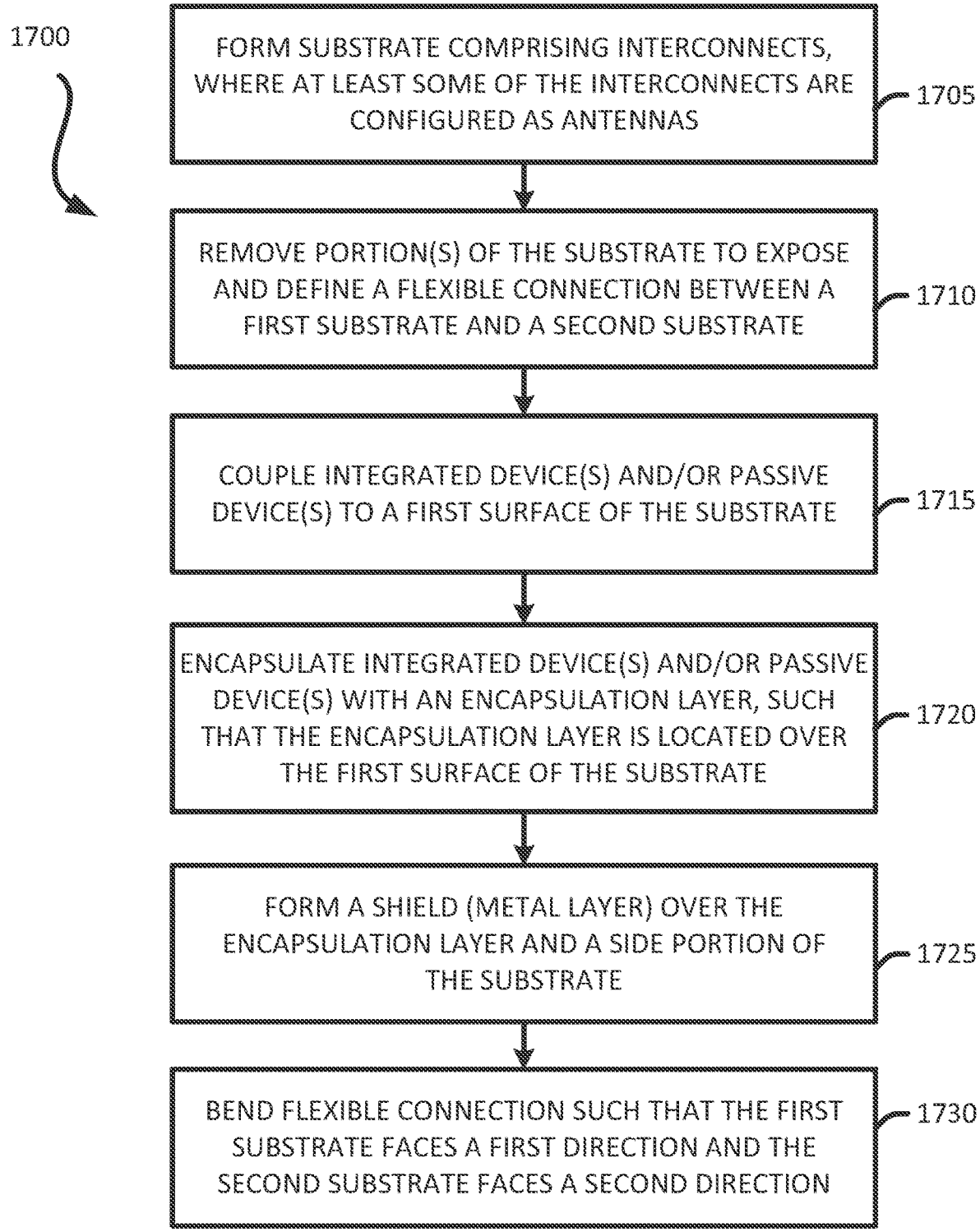
FIG. 17 illustrates an exemplary flow diagram of a method for fabricating a device that includes several substrates each having an embedded antenna.

Exemplary Flow Diagram of a Device Comprising Substrates with Multi-Directional Antennas and Flexible Connection In some implementations, fabricating a device that includes several substrates with multi-directional antennas includes several processes. FIG. 17 illustrates an exemplary flow diagram of a method 1700 for providing or fabricating a device that includes several substrates with multi-directional antennas. In some implementations, the method 1700 of FIG. 17 may be used to provide or fabricate the device 200 of FIG. 2 described in the disclosure. However, the method 1700 may be used to provide or fabricate any of the devices (e.g., 300, 500, 600, 700, 800, 900, 1000, 1100, 1200, 1300, 1400, 1500) described in the disclosure.

It should be noted that the sequence of FIG. 17 may combine one or more processes in order to simplify and/or clarify the method for providing or fabricating a device that includes several substrates with multi-directional antennas. In some implementations, the order of the processes may be changed or modified.

The method forms (at 1705) a substrate (e.g., 1670) that include at least one dielectric layer (e.g., 221) and interconnects (e.g., 223). Some of the interconnects may form one or more antennas in the substrate. The fabrication of the substrate may include a lamination process and a plating process. Examples of processes for fabricating a substrate includes a semi additive process (SAP) and a modified semi additive process (mSAP). However, different implementations may fabricate a substrate differently. Stages 1-10 of FIGS. 16A-16C illustrate an example of fabricating a substrate that may include antennas (e.g., embedded antennas).

The method removes (at 1710) portions of the substrate (e.g., 1670) to expose and/or define a flexible connection 206 between a first substrate (e.g., 220) and a second substrate (e.g., 240). An etching process, a mechanical process, and/or a laser process may be used to remove portions of the substrate 1670. Portions of a substrate that are removed include at least one dielectric layer. In some implementations, at least one metal layer (e.g., interconnects) may be removed. Stage 11 of FIG. 16D illustrates an example of portions of a substrate that have been removed to form a flexible connection 206.

The method couples (at 1715) integrated device(s) (e.g., 222, 224, 242) and/or passive device(s) (e.g., 226, 228, 246) to a first surface of at least one substrate (e.g., 220, 240). Solder interconnects may be used to couple the integrated device(s) and/or passive device(s) to the substrate. A reflow process may be used to couple the integrated devices and passive devices to the substrate. Stage 12 of FIG. 16D illustrates an example of integrated device(s) and/or passive device(s) coupled to at least one substrate.

The method encapsulates (at 1720) the integrated device (s) and the passive device(s) with at least one encapsulation layer (e.g., 210, 270). For example, the encapsulation layer 210 may be provided such that the encapsulation layer 210 encapsulates the integrated devices and/or passive devices located over the substrate. Different implementations may provide the encapsulation layer 210 over the substrate by using various processes. For example, the encapsulation layer 210 may be provided over the substrate by using a compression and transfer molding process, a sheet molding process, or a liquid molding process. Stage 13 of FIG. 16E illustrates an example of at least one encapsulation layer formed over at least one substrate.

The method forms (at 1725) a shield (e.g., 230, 250) over the encapsulation layer (e.g., 210, 270) and over a side portion of the substrate 220 and the substrate 240. The shield 212 may include one or more metal layers (e.g., patterned metal layer(s)). The shield 212 may be configured to operate as an electromagnetic interference (EMI) shield. A plating process, a chemical vapor deposition (CVD) process, a physical vapor deposition (PVD) process, a sputtering process, and/or a spray coating may be used to form the shield. Stage 14 of FIG. 16E illustrates an example of forming a shield over the encapsulation layer and/or the substrate.

The method bends (at 1730) the flexible connection (e.g., 206) to position the substrate 240 relative to the substrate 220 such that the substrate 220 faces a first antenna direction, and the substrate 240 faces a second antenna direction that is different than the first antenna direction. Stage 15 of FIG. 16F illustrates an example of bending the flexible connection that couples two substrates. In some implementations, the method may provide a protective material around the flexible connection 206.

Exemplary Electronic Devices

Figure 18:
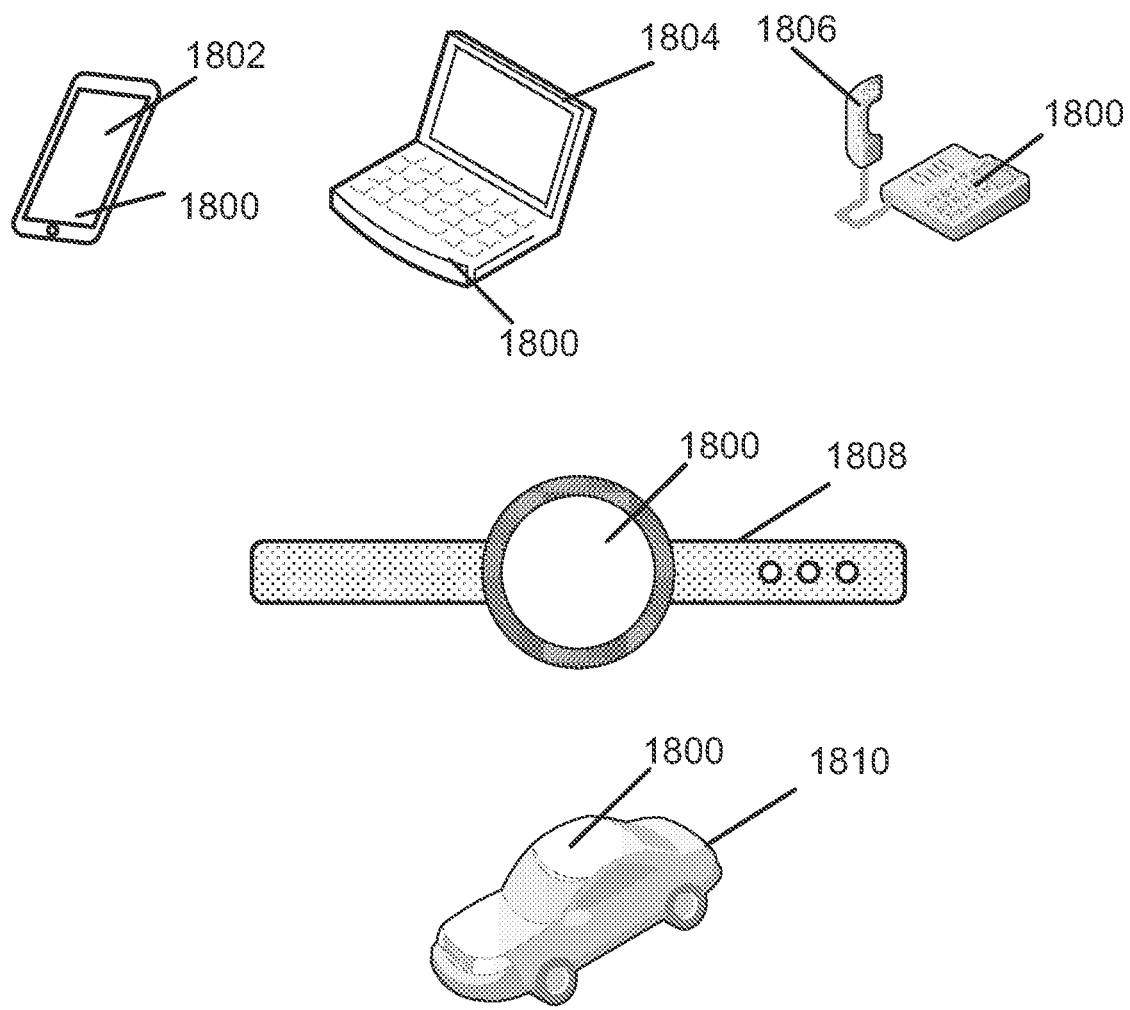
FIG. 18 illustrates various electronic devices that may integrate a die, an integrated device, an integrated passive device (IPD), a passive component, a package, and/or a device package described herein.

FIG. 18 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1802, a laptop computer device 1804, a fixed location terminal device 1806, a wearable device 1808, or automotive vehicle 1810 may include a device 1800 as described herein. The device 1800 may be, for example, any of the devices and/or integrated circuit (IC) packages described herein. The devices 1802, 1804, 1806 and 1808 and the vehicle 1810 illustrated in FIG. 18 are merely exemplary. Other electronic devices may also feature the device 1800 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-15, 16A-16F, and/or 17-18 may be rearranged and/or combined into a single component, process, feature or function or embodied in several components, processes, or functions. Additional elements, components, processes, and/or functions may also be added without departing from the disclosure. It should also be noted FIGS. 2-15, 16A-16F, and/or 17-18 and its corresponding description in the present disclosure is not limited to dies and/or ICs. In some implementations, FIGS. 2-15, 16A-16F, and/or 17-18 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first, second, third or fourth. For example, a component that is referred to a second component, may be the first component, the second component, the third component or the fourth component. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal), ground and/or power. An interconnect may be part of a circuit. An interconnect may include more than one element or component. An interconnect may be defined by one or more interconnects. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
    a first substrate comprising a first antenna;
    an integrated device coupled to the first substrate;
    an encapsulation layer located over the first substrate and the integrated device, wherein the encapsulation layer encapsulates the integrated device;
    a second substrate comprising a second antenna;
    a flexible connection coupled to the first substrate and the second substrate, wherein the flexible connection is embedded in the first substrate and the second substrate; and a shield coupled to (i) a surface of the encapsulation layer and (ii) a side surface of the first substrate that is above and below where the flexible connection embeds in the first substrate.

2. The device of claim 1, wherein the flexible connection is configurable to be bendable by 180 degrees.

3. The device of claim 1,
wherein the shield is configured as an electromagnetic interference (EMI) shield.

4. The device of claim 1, wherein the flexible connection comprises:
at least one dielectric layer;
at least one interconnect; and
a protective material that covers the at least one dielectric layer and the at least one interconnect.

5. The device of claim 4, wherein the at least one dielectric layer and the at least one interconnect of the flexible connection, extend into the first substrate and the second substrate.

6. The device of claim 1,
wherein the first antenna is embedded in the first substrate,
wherein the first substrate is configurable to face a first antenna direction,
wherein the second antenna is embedded in the second substrate, and
wherein the second substrate is configurable to face a second antenna direction.

7. The device of claim 1, wherein the first substrate and the integrated device form a first package for the device.

8. The device of claim 7, wherein the first package includes an antenna in package (AiP).

9. The device of claim 1, further comprising:
a second integrated device coupled to the second substrate;
a second encapsulation layer located over the second substrate and the second integrated device, wherein the second encapsulation encapsulates the second integrated device; and
a second shield coupled to (i) a surface of the second encapsulation layer and (ii) a side surface of the second substrate.

10. The device of claim 1, wherein the device is incorporated into a particular device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

11. An apparatus comprising:
a first substrate comprising a first antenna;
an integrated device coupled to the first substrate;
means for encapsulation located over the first substrate and the integrated device wherein the means for encapsulation encapsulates the integrated device;
a second substrate comprising a second antenna;
means for flexible connection coupled to the first substrate and the second substrate wherein the means for flexible connection is embedded in the first substrate and the second substrate; and
means for shielding coupled to (i) a surface of the means for encapsulation and (ii) a side surface of the first substrate that is above and below where the means for flexible connection embeds in the first substrate, wherein the means for shielding is configured as a means for electromagnetic interference (EMI) shielding.

12. The apparatus of claim 11, wherein the means for flexible connection is configurable to be bendable by 180 degrees.

13. The apparatus of claim 11,
wherein the means for shielding is configured as means for electromagnetic interference (EMI) shielding.

14. The apparatus of claim 11, wherein the means for flexible connection comprises:
at least one dielectric layer;
at least one interconnect; and
a protective material that covers the at least one dielectric layer and the at least one interconnect.

15. The apparatus of claim 14, wherein the at least one dielectric layer and the at least one interconnect of the means for flexible connection, extend into the first substrate and the second substrate.

16. The apparatus of claim 11,
wherein the first antenna is embedded in the first substrate,
wherein the first substrate is configurable to face a first antenna direction,
wherein the second antenna is embedded in the second substrate, and
wherein the second substrate is configurable to face a second antenna direction.

17. The apparatus of claim 11, wherein the first substrate and the integrated device form a first package for the apparatus.

18. The apparatus of claim 17, wherein the first package includes an antenna in package (AiP).

19. The apparatus of claim 11, further comprising:
a second integrated device coupled to the second substrate; and
means for second encapsulation located over the second substrate and the second integrated device.

20. The apparatus of claim 11, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

21. A method for fabricating a device, comprising:
providing a substrate comprising a first antenna and a second antenna;
removing portions of the substrate to define (i) a first substrate comprising the first antenna, (ii) a second substrate comprising the second antenna, and (iii) a flexible connection coupled to the first substrate and the second substrate;
coupling an integrated device to the substrate; and
forming an encapsulation layer over the substrate and the integrated device.

22. The method of claim 21, further comprising forming a shield located over the encapsulation layer.

23. The method of claim 22,
wherein the shield is formed over a side surface of the first substrate, and
wherein the shield includes an electromagnetic interference (EMI) shield.

24. The method of claim 21, wherein the flexible connection is embedded in the first substrate and the second substrate.

25. The method of claim 21,
wherein the first antenna is embedded in the first substrate,
wherein the first substrate faces a first antenna direction,
wherein the second antenna is embedded in the second substrate, and
wherein the second substrate faces a second antenna direction.

\* \* \* \* \*